US006642869B2

(12) United States Patent
Kuyel et al.

(10) Patent No.: US 6,642,869 B2
(45) Date of Patent: Nov. 4, 2003

(54) PIECEWISE LINEAR CALIBRATION METHOD AND CIRCUIT TO CORRECT TRANSFER FUNCTION ERRORS OF DIGITAL TO ANALOG CONVERTERS

(75) Inventors: Turker Kuyel, Rowlett, TX (US); Kumar Lakshmi Parthasarathy, Ames, IA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/063,509

(22) Filed: May 1, 2002

(65) Prior Publication Data

US 2003/0160713 A1 Aug. 28, 2003

Related U.S. Application Data

(60) Provisional application No. 60/319,131, filed on Feb. 28, 2002.

(51) Int. Cl.[7] .............................................. H03M 1/10
(52) U.S. Cl. ..................................... 341/120; 341/144
(58) Field of Search ................................ 341/120, 144, 341/118, 119, 117, 161; 358/461; 702/107

(56) References Cited

U.S. PATENT DOCUMENTS

| 4,222,107 A | * | 9/1980 | Mrozowski et al. ........ 702/107 |
| 4,967,197 A | * | 10/1990 | Peng ........................... 341/118 |
| 5,153,592 A | * | 10/1992 | Fairchild et al. ............ 341/118 |
| 5,204,761 A | * | 4/1993 | Gusmano ..................... 358/461 |
| 5,451,946 A | * | 9/1995 | Smith et al. ................. 341/118 |
| 5,663,728 A | | 9/1997 | Essenwanger |
| 5,825,317 A | * | 10/1998 | Anderson et al. ........... 341/120 |
| 5,859,606 A | | 1/1999 | Schrader et al. |
| 6,240,130 B1 | | 5/2001 | Burns et al. |
| 6,246,351 B1 | | 6/2001 | Yilmaz |
| 6,313,769 B1 | * | 11/2001 | Mangahas et al. .......... 341/118 |
| 6,351,228 B1 | * | 2/2002 | Kutsuno et al. ............. 341/120 |
| 6,417,794 B1 | * | 7/2002 | Munoz et al. ............... 341/161 |

OTHER PUBLICATIONS

Imamura et al., SP 23.4: A 12b–Channel Trimless DAC, Yokogawa Electric Corp. (No date).
DAC8542 Dual Channel, Low Power, 16–Bit Parallel Input Digital–to–Analog Converter, Burr–Brown Products Jun. 7, 2001.
DAC8541 16BIT, Single Channel, Parallel Input Digital–to–Analog Converter with Rail–to–Rail Voltage Output, Texas Instruments 12/01.

* cited by examiner

*Primary Examiner*—Jean Bruner Jeanglaude
(74) *Attorney, Agent, or Firm*—W. Daniel Swayze, Jr.; W. James Brady; Frederick J. Telecky, Jr.

(57) ABSTRACT

A calibrated digital-to-analog converter (DAC) (15') has a main DAC (17) having a digital input and an analog output. An on-chip memory (21) stores measured INL values of the main DAC at a few selected input codes, and digital interpolation (50,17) is used to approximate INL error values at all input codes ($14 \ldots 14^{V7}$). To cancel the INL errors of the main DAC, outputs of this digital interpolation are sent to a calibration DAC (19), which has an analog output subtracted from the analog output of the main DAC. This subtraction can also be done in the digital domain, removing the need for a calibration-DAC when a main DAC with higher bit-count is designed.

35 Claims, 5 Drawing Sheets

PIECEWISE LINEAR CALIBRATION METHOD AND CIRCUIT TO CORRECT TRANSFER FUNCTION ERRORS OF DIGITAL TO ANALOG CONVERTERS

BACKGROUND OF INVENTION

1. Field of Invention

This invention relates to improvements in digital-to-analog converters and methods for constructing and operating same, and more particularity to digital-to-analog converters having improved linearity and methods for constructing and operating same.

2. Background Information

Digital-to-analog converters (DACs) are circuits used to convert digital codewords into analog signals. Each codeword that is applied to the digital input of the DAC represents a quantized value that is converted by the DAC into a corresponding analog value at its output according to the transfer function of the DAC. Typically, but not necessarily, each bit of the digital input codeword is weighted as a function of the position of the respective bits within the codeword. When the position weights of each of the bits in a codeword are summed, they produce a value to be represented by the magnitude, typically the voltage magnitude, of the analog output signal.

However, offset, gain, and integral linearity (INL) of ordinary DAC circuits are imperfect, and often result in the analog output values having an error component from that desired. (INL error is the maximum deviation of an actual transfer function of a DAC from the ideal transfer function of the DAC, after the effects of offset and gain errors are mathematically removed from the actual transfer function of the DAC.)

What is needed, therefore, is a circuit and method for improving or reducing the error or deviation of the main DAC circuit in converting a digital data input to analog output values, so that the output is produced more closely following a desired transfer function. The circuit and method are needed to replace expensive laser-trimming techniques that are widely used in the industry.

SUMMARY OF INVENTION

In light of the above, therefore, it is an object of the invention to provide an improved digital-to-analog converter that has improved linearity and methods for constructing and operating same.

It is another object of the invention to provide an improved digital-to-analog converter of the type described that can be calibrated in a one-pass test flow.

The present invention presents a digital-to-analog converter (DAC) with digital calibration to improve the overall integral nonlinearity (INL) performance. In one embodiment, the architecture includes of a 10 bit resistor string that decodes the 10 most significant bits (MSBs) and a 6 bit interpolating amplifier, which is used to decode the 6 least significant bits (LSBs). The DAC has digital calibration to improve INL characteristics. The resistor string architecture alone has good differential nonlinearity (DNL) characteristics, but suffers from high INL errors. Thus, transfer function errors of the DAC are computed during final test at specific points. The errors at these points are coded into permanent on-chip memory as control points. These control points then drive digital circuits that implement the math for piece-wise linear calibration waveform generation. A calibration DAC then sums the inverse of the error voltage to correct for the offset gain and linearity errors.

One calibration approach of the invention is to digitally calibrate the DAC based on the performance results obtained from a tester. At the time of final testing, the INL is evaluated using the standard linearity test methods. The INL values at certain specific codes are stored in registers. This can be achieved, for example, by blowing certain fuses based on the values read from the tester. The calibration module then uses the values stored by fuse blowing, and the DAC calibrates itself by subtracting an approximation to its INL curve. The approach of the invention does not actually modify the architecture of the DAC, but digitally calibrates its performance. This is achieved by calculating the INL from the tester and then adding or subtracting a desired amount of signal to or from the output of the main DAC before the signal is outputted from the device. In a preferred embodiment, this requires an additional calibration DAC along with the main DAC.

According to a broad aspect of the invention, a method is presented for constructing a calibrated digital-to-analog converter (DAC). The method includes developing predetermined functions between adjacent pairs of selected digital input code values approximating deviations of actual analog output values of a main DAC from desired analog output values of the main DAC and configuring a programmable circuit to provide piecewise linear digital correction input values to a calibration DAC according to the piecewise linear functions. The calibration DAC provides analog correction values for subtraction from an analog output of the main DAC to provide calibrated analog output values. Preferably, the predetermined functions are piecewise linear functions.

According to another broad aspect of the invention, a method is presented for constructing a calibrated digital-to-analog converter (DAC). The method includes providing an uncalibrated main DAC having a digital input and an analog output. When digital input signal values are applied to the digital input, corresponding analog output values are produced on the analog output. A deviation of an actual analog output value from a desired analog output value is measured for each of a number of digital input code values, and sets of linearly varying values are developed between adjacent pairs of selected digital input code values. The sets approximate the measured nonlinearity values. A programmable circuit is configured to provide digital correction input values to a calibration DAC according to the linearly varying values. When a digital input code value is applied to the digital input of the main DAC, an analog output of the calibration DAC is subtracted from the analog output of the main DAC to provide a calibrated output value.

According to yet another broad aspect of the invention, a method is presented for constructing a digital-to-analog converter (DAC). The method includes constructing an uncalibrated DAC that includes a circuit for producing an analog output signal having a magnitude that corresponds to a digital input according to a predetermined digital input signal code. A predetermined sequence of digital input signal codes produces corresponding analog output values according to an actual transfer function, a memory, and digital circuits configured to modify the digital input signal codes according to states contained in the memory. For each of predetermined digital input code values, a corresponding error value is determined representing a deviation of an actual value of the analog output produced by the actual transfer function from a desired analog output value according to a desired transfer function. States representing the corresponding error values are coded into the memory, and the digital circuits are operated to modify the predetermined digital input codes according to the states in the memory to produce the desired analog output values.

According to yet another broad aspect of the invention, a calibrated digital-to-analog converter (DAC) is presented. The DAC includes a main DAC having a digital input and an analog output. When digital input signal values are applied to the digital input, corresponding analog output values are produced on the analog output. A memory contains sets of linearly varying values between adjacent pairs of selected digital input code values. The sets approximate deviations of actual analog output values from desired analog output values. A calibration DAC has an analog output connected to be subtracted from the analog output of the main DAC, and a control circuit selects values from the sets of linearly varying values corresponding to input digital values to the main DAC and apply the selected values to the calibration DAC.

According to still yet another broad aspect of the invention, a calibrated digital-to-analog converter (DAC) is presented. The calibrated DAC includes a main DAC having a digital input and an analog output. When digital input signal values are applied to the digital input, corresponding actual analog output values are produced on the analog output. During final testing, integral linearity error (INL) is measured by the tester, and a subset of INL values called "control points" are written to on-chip memory. Each control point datum in the memory has a first component that represents the digital input code at which a specific INL error occurs, and a second component that represents the value of the actual INL error at that specific digital input code. Each control point is spaced from an adjacent control point to contain a predetermined range of actual analog output values. Circuitry for generating linearly varying deviation values between two adjacent control points is provided to drive calibration DAC, which has an analog output connected to be subtracted from the actual analog output value of the main DAC. A control circuit selects a pair of control points, and the deviation values of the calibration DAC is obtained by interpolating the second components of adjacent control points when the digital input of the main DAC falls between the first components of these two adjacent control points.

BRIEF DESCRIPTION OF DRAWINGS

The invention is described with reference to the accompanying drawing, in which.

In the various figures of the drawing, like reference numerals are used to denote like or similar parts.

DETAILED DESCRIPTION

Figure 1:
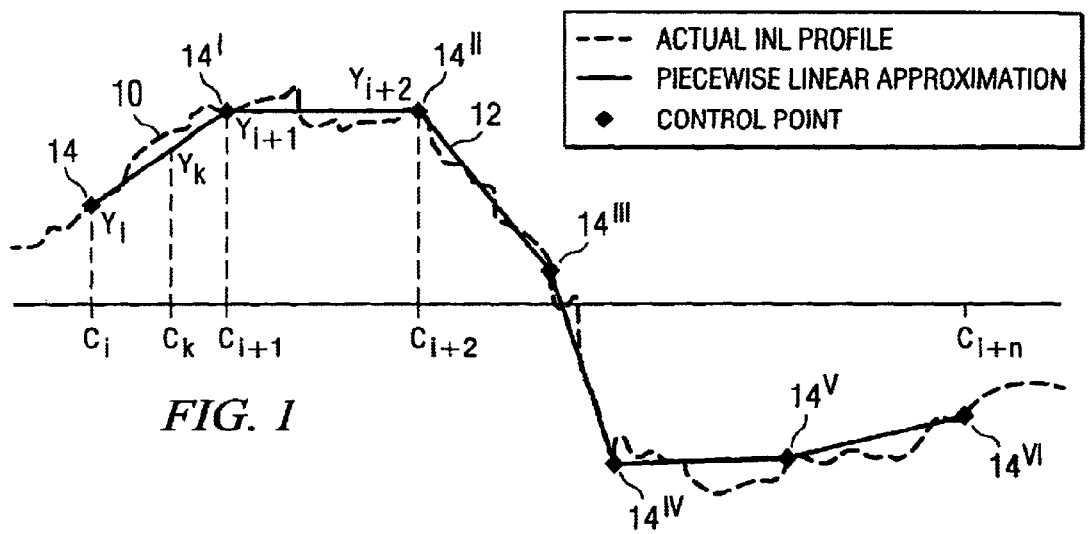
FIG. 1 is a graph of integral nonlinearities (INLs) vs. input code word values, comparing a curve of a typical actual DAC INL with a piecewise linear approximation thereof, in accordance with a preferred embodiment of the invention.

According to a preferred embodiment of the invention, a calibration method is presented to calibrate a DAC, constructed according to a preferred embodiment of the invention. Briefly, the method is to digitally calibrate the DAC based on performance results obtained from a tester using a series of piecewise linear INL approximations, as shown in FIG. 1. DAC testers to develop integral and differential linearity (INL and DNL) performance information over a range of DAC inputs and outputs are well known in the art, and are not described in detail herein. Using the circuit 15 of FIG. 2, according to one method of the invention, the steps shown in FIG. 3 at the time of final testing and during subsequent operation of the circuit evaluate INL using the standard tester and the linearity information. INL values at certain specific codes, which are stored, for example, in registers. One way by which this can be achieved is by blowing certain fuses based on the values read from the tester. A controller then selects and uses the values stored by the fuse blowing operation, and the DAC calibrates itself by subtracting an interpolated approximation to its actual INL curve. Interpolation saves memory, thefore die area The approach suggested does not actually modify the architecture of the circuit, but digitally calibrates its performance. This is achieved by subtracting a piece-wise linear approximation of the INL error from the output of the main DAC before outputting the signal. This requires an additional calibration DAC along with the main DAC.

Figure 2:
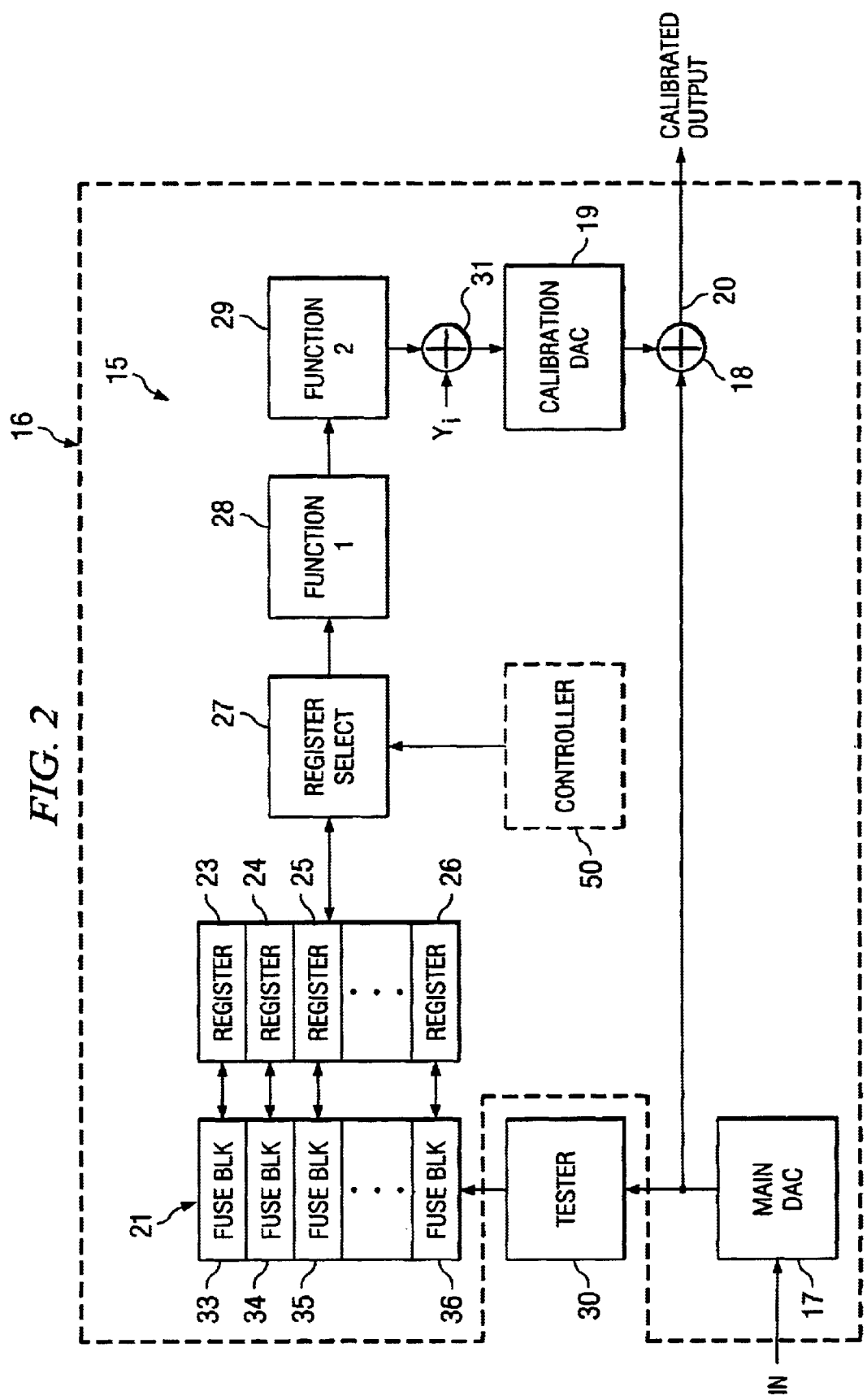
FIG. 2 is a block diagram of an architecture for calibrating a DAC, in accordance with a preferred embodiment of the invention.

One embodiment of calibration circuit architecture 15 with which the method of the invention can be used is shown in FIG. 2, to which reference is now made. FIG. 2 shows a block diagram of a calibration circuit architecture 15 for calibrating a DAC with the various circuit components thereof constructed on an integrated circuit chip 16. The calibration circuit 15 includes a main DAC 17 that is to be calibrated in the final circuit embodiment, a calibration DAC 19, data registers 23–25, a fuse block 21 containing fuse links to configure the data registers, and digital blocks 2729 for register selection and arithmetic operations.

The embodiment of the calibration circuit 15 shown in FIG. 2 is a setup circuit to configure and calibrate the overall DAC, as below described, and therefore includes a tester 30 to sample the output from the main DAC 17 to control and configure the fuse links 21, as below described. In the actual implementation of the circuit 15 after calibration, the tester 30 is not employed in the circuit 15, but a control circuit 50, shown in dotted lines in FIG. 2, is used to select the appropriate piecewise linear correction segment, in a manner below described with reference to FIGS. 3 and 5. The tester may be implemented by automated test equipment (ATE), the setup and operation of which being within the scope of those skilled in the art. It should be understood that although the invention is described in the context of a DAC, the principles of the invention may also be applied to an analog-to-digital converter (ADC) as well, since ADCs include internal DACs.

Figure 3:
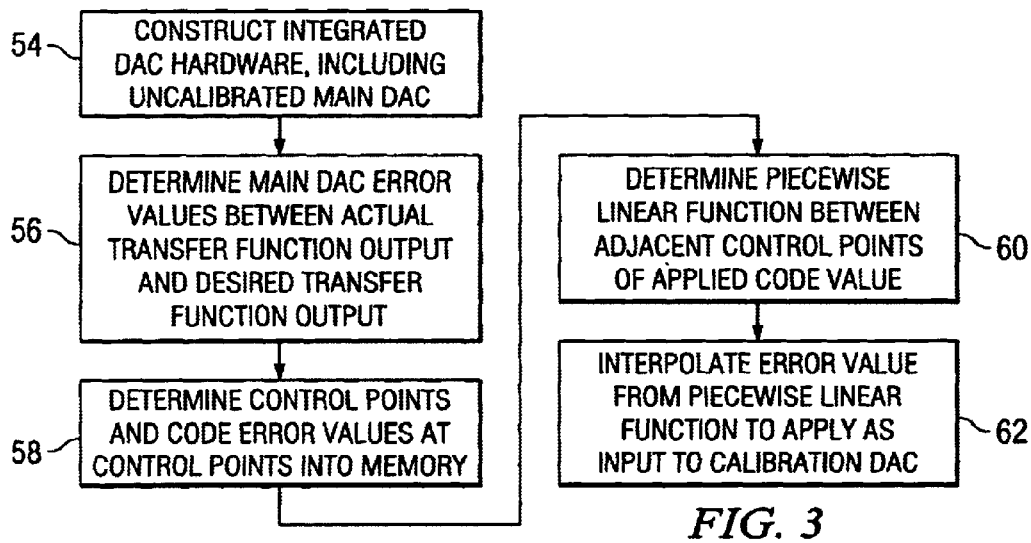
FIG. 3 is a flow chart showing steps for setting up the calibrated DAC of FIG. 5, in accordance with a preferred embodiment of the invention.

Thus, as shown, the output of the main DAC 17 is sent to an analog summing circuit 8, from which the output 20 from the overall DAC circuit 15 is derived. The output from the main DAC 17 is also sent to the tester 30. The output from the tester 30 is used to evaluate the INL from the captured data and to selectively blow fuses in the fuse block 21 based on the evaluated INL values, the fuse selection process being described below in detail. The fuse block 21 contains a number of fuse banks, four banks 33–35 . . . 36 being shown for illustration. In practice, one fuse bank may be used for each piecewise linear signal section, as will become apparent below. Each bank of fuses 33–35 . . . 36 stores the INL value (in LSBs) at a particular control point, also described in detail below. Other forms of non-volatile memory cana replace fuses With reference now back to FIG. 1, a graph is shown of the actual integral nonlinearities (INL) of the main DAC 17 vs. input code word values. The graph of FIG. 1 compares a curve 10 of typical INL values of the signal output of an actual DAC constructed in accordance with a preferred embodiment of the invention with a piecewise linear approximation thereof 12. The piecewise linear approximation curve 12 is developed from the uncalibrated DAC having the INL profile 10, which follows the waveform shown, by selecting a set of codes, for example, conveniently based upon the waveshape of the measured, or actual, INL. Each code location X, and the corresponding INL value, Y, at selected codes constitutes a "control point", $C_i(X_i,Y_i), C_{i+1}(X_{i+1},Y_{i+1}) \ldots C_{i+n}(X_{i+n},Y_{i+n})$ 14, 14$^I$ . . . 14$^{VI}$. The piecewise linear approximation 12 of the INL curve 10 then allows linear interpolation between each adjacent pairs of the control points 14 and 14$^I$, . . . 14$^V$ and 14$^{VI}$ to approximate INL for any input code, for example, at point 14$^k$ corresponding to codeword $C_k$. At this juncture, it should be noted that although the piecewise linear curves are shown as each being a single, continuous linear waveform, the waveforms may follow other piecewise linear curves as well. For example, the piecewise linear curves may be saw-tooth or other convenient waveform. Moreover, although presently piecewise linear INL approximations are preferred, linearity error can also be approximated and removed by implementing higher order polynomials, such as B-Splines, in the digital domain, as shrinking process geometries make this feasible. These approximation curves then can be used to construct and operate a calibrated DAC circuit, such as the calibrated DAC circuit of FIG. 5, using the steps shown in FIG. 3. The method and apparatus of this invention makes INL calibration possible through interpolation, without actually storing the INL values for most of the DAC inputs As shown in FIG. 3, the method of setting up and operating the calibrated DAC of the invention includes first constructing the hardware of the circuit, including the uncalibrated main DAC 17 on an integrated circuit chip 54. The error values between the actual transfer function of the main DAC 17 and a desired transfer function of the main DAC 17 are then determined 56. Using the error values determined, a number of. control points are established, and the code error values are coded into a memory 58. The memory may be a number of fuse links of the type shown in FIG. 2, or other type of memory described below.

After the error values are coded into the memory, when a code value is applied to the input of the DAC, a determination is made as to between which two adjacent control points the code value lies, and a piecewise linear function is established between the two control points 60. Finally an error value is interpolated from the piecewise linear function at the applied input code value, and the error value is applied to the input of the calibration DAC to develop an analog output that is subtracted from the output of the main DAC 62.

Still more particularly, to determine the control points to use let $C_i, C_{i+1}, C_{i+2}$ . . . be the X-axis values of the control points and $Y_i, Y_{i+1}, Y_{i+2}$ . . . be the measured INL values at the corresponding X-axes control point values. Let $C_k$ be any arbitrary input code. The first step in the method is to select the appropriate pair of control points between which the input code lies. The second step is to interpolate and find out the INL valued at the arbitrary input code by using the INL values of the control points between which the input lies.

Once the approximate value of the INL is obtained at the input code, a calibration DAC is used to convert this digital code to an analog value, which is then subtracted from the output of the main DAC 17. This results in a value determined in accordance with the following Equation 1:

[0033]

$$Y_k = Y_i + \left(\frac{Y_{i+1} - Y_i}{C_{i+1} - C_i}\right)(C_k - C_i)$$

Figure 5:
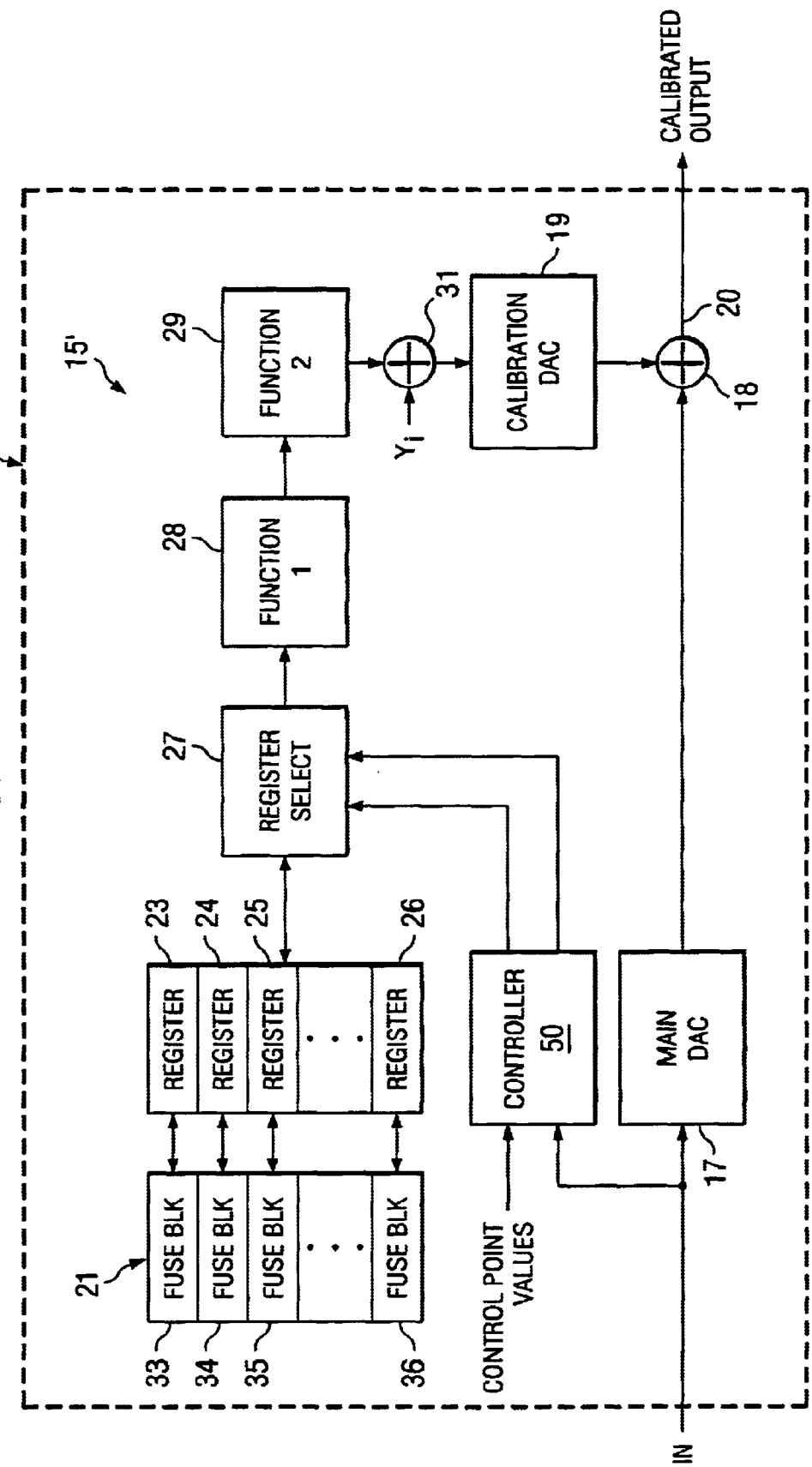
FIG. 5 is a block diagram of a calibrated DAC architecture, in accordance with a preferred embodiment of the invention.

Thus, to operate the circuit 15' of FIG. 5 for a given arbitrary input code, the "X" axis values of a correct pair of control points between which the arbitrary input lies are determined. The INL value corresponding to the arbitrary input is then obtained by using the slope of the line joining the "Y" axis values (INL values) of the two control points (see FIG. 1). The arithmetic logic blocks 27–29 hown in FIGS. 1 and 5 perform these operations. The output of the digital block 27–29 is then sent to the calibration DAC 19, whose analog output is then subtracted from the output of main DAC 17 in the adder 18. As shown, an offset value, $Y_i$, may be added to the correction value in the adder 31. The offset value, as can be seen from the control point 14 in FIG. 1, may be the initial INL value at which the piecewise linear curve begins to enable the particular INL interpolated values to be properly interpreted.

In the design of the circuit 15, some tradeoffs may be involved in determining the total number of control points 14, 14$^I$ . . . 14$^{VI}$ that are employed. Although the number of control points is a matter of design choice, it is apparent that the larger the number of control points, the more accurate is the approximation of the INL that can be obtained. On the other hand, the larger the number of control points, the more fuses that are required to implement the circuit, and increasing the number of fuses jeopardizes the reliability of the circuit. Typically, each control point requires two sets of fuses, one for storing the "X"" axis value of the control point, and one for storing the corresponding "Y" value.

By careful selection of the control points 14, 14$^I$ . . . 14$^{VI}$ the required number of fuses can be reduced. More particularly, by selecting control points that have a fixed X axis relationship, the requirement for blowing fuses for the X axis of the control points can be removed, so that one set of fuses to store the Y axis values can be sufficient for each control point. The first and last control points can represent the offset and gain error of the DAC. As an example, in some cases, seven bits (including sign) may be enough for the Y-axis of each control point to represent INL error within +/−1 LSB at each control point. (Any more bits may be unnecessary due to the inaccuracy of the piecewise linear approximation to the INL). Therefore, to represent each control point, seven fuses may be used. If an eight-piece segment with nine control points were chosen (including zero scale and full-scale points), a total of 63 fuses would be required. Although this may be a high number of fuses, it is not unreasonable.

It should be noted that as an option, either the difference in the control point values may be stored in the fuses, or, alternatively, the actual control point value may be stored. Storing the difference in control point values requires eight fuses for each control point (since the difference can range from 128 to 128 LSBs) amounting to a total of 72 fuses. This eliminates the need for a subtraction circuit. However, as can be seen from Equation 1 above, the actual value of each control point is required to evaluate the final expression. Thus, it may be desirable in some cases to store the actual control points rather than the difference.

In operation, to determine to identify which is the correct pair of control points between which the arbitrary input code lies, the first few MSBs of the input code and the control points may be compared. The arithmetic blocks 28 and 29 then perform division and multiplication functions, as follows. The calculation of slope of the applicable piecewise linear segment in Equation 1 requires division by the difference in the input code values of two adjacent control points. To make this division operation simple, the control points can conveniently be spaced uniformly with a known X axis spacing of "k times a power of 2". The difference in the x-axis of two adjacent control points is then a power of two, so the division will be a simple arithmetic right shift. The right shift operation can be achieved by just connecting the data buses in an appropriate manner, and thus the requirement of the shift register can be totally eliminated.

Thus, the function accomplished by the Func 1 block 28 in the circuits of FIGS. 2 and 5 can be $C_{input}-C_i$ to achieve the delta C value between $C_i$ and the input word. The function accomplished by the Func 2 block 29 then determines the slope of the selected piecewise linear segment and multiplies it times the delta C value. To accomplish the digital multiplication functions based on the INL range of +/−64 LSBs, the difference in the Y-axis of two adjacent control points can be maximum +128 or minimum −127. This can be coded in eight bits. Also, 14 bits may represent the difference between the X-axis of the previous control point and the input code. Therefore a 14*8 multiplier may be required for this operation.

In the example above, the INL can be shown to be +/−64 LSBs. This is equivalent to nine-bit accuracy (+/−0.5 LSB at nine bits). Since the main DAC 17 is accurate to nine bits, the signal that is obtained from the output of the calibration DAC needs to be accurate to at least 11–12 bits to make calibration reasonable. If a more accurate main DAC 17 is desired, design redundancy and tester feedback can be used.

Figure 4:
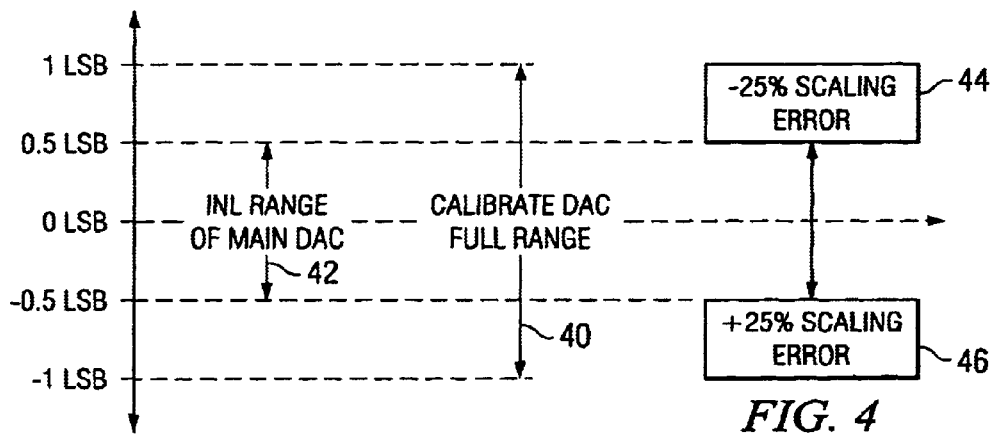
FIG. 4 is a graph comparing the full-scale range of the calibration DAC with the INL range of the main DAC to insure that the calibration DAC has sufficient range to correct for the INL of the main DAC for an assumed +/−25% overall scaling error, in accordance with a preferred embodiment of the invention.

It should be noted that it may be necessary to establish the full-scale range 40 of the calibration DAC 19 (see FIG. 4) to be about twice the INL range 42 of the main DAC 17. This is because, if +/−25% overall scaling error is assumed as discussed above, the calibration DAC 19 should still have enough range to correct for the INL of the main DAC 17. Thus, as shown in FIG. 4, with a 25% scaling error 44 on the calibration DAC 19 high voltage and +25% scaling error 46 on the calibration DAC 19 low voltage, the calibration DAC 19 still has enough range to cover the worst case main DAC 17 INL.

Assuming also that the calibration DAC 19 has sufficient resolution (for example, 8–10 bits, to resolve the range with minor calibration DAC INL and DNL errors), it is reasonable to expect that the zero scale and the full-scale error of the calibration DAC 19 will dominate the overall errors of the calibration DAC 19. The zero scale error will simply add as an offset to the main DAC 17. But the full-scale error will be a problem. This full-scale error of the calibration DAC 19 can be fixed by evaluating a partial INL once more in the test program, using the following technique.

First, the tester 30 evaluates the INL with the outputs of the calibration DAC 19 set at a constant zero. Since the INL is evaluated only at the X-axes of the control points, the evaluation is fast. This test shows how much calibration is needed for the main DAC 17. The corresponding trim words are determined and written into temporary registers.

Second the tester 30 evaluates the INL again, with the temporary trim words in effect. The INL is evaluated again, but only at the control points. After the first calibration, the INL should be zero at the control points, but it will not be, due to the full-scale error of the calibration DAC 19. From the new INL readings, the calibration DAC 19 full-scale error can be determined. To take the full-scale error of the calibration DAC 19 into account, the trim coefficients are readjusted.

Finally, fuses are blown according to the readjusted trim coefficients. At this point, "all codes" INL may be evaluated to assure specification compliance. Thus, the calibration cycle includes two partial INL evaluations, at only control points, and one final evaluation, at all codes. The first partial INL evaluation gives information about the inaccuracies of the main DAC 17, and the second partial INL evaluation gives information about the calibration DAC 19. The trim coefficients are then determined based on the results of both partial INL evaluations. Thus, by repeating the test twice, the calibration DAC 19 can also be calibrated. Other methods can also be used to adjust the gain error of the calibration DAC To preserve the monotonicity of the circuit, it is important to ensure that the calibration step does not improve INL at the cost of DNL. Therefore, the DNL budget for calibration may be set at not more than +/−0.25 LSBs at 16 bits in order to maintain monotonicity. If the range of the calibration DAC 19 is +/−1 LSB at 9 bits (assuming scale-down by a factor of 256), and if the calibration DAC 19 has 8 bits of resolution, a related DNL error of +/−0.5 LSBs at 16 bits results. This may be too much for some applications. Therefore, the calibration DAC 19 needs to have at least 10 bits of resolution to get a DNL of +/−0.125 LSB. This is no extra burden if an R−2R architecture is used for the calibration DAC 19.

Furthermore, if the main DAC 17 has a specification of +/−64 LSB INL, the worst case INL difference between two consecutive control points can be +128 LSBs or −128 LSBs. This then requires a 10-bit calibration DAC 19 as explained above. But if a 2× redundancy is included in INL specification of the main DAC 17, the calibration DAC 19 needs to be set to a range of +/−256 LSB at 16 bits. Considering a 7-bit range division, and resolution to 0.125 LSBs at 16 bits, a 12-bit calibration DAC 19 is required. So for good monotonicity, a 128 range divider and a 12-bit calibration DAC 19 are needed. These constitute design choices on a specific main DAC 19, and are not intended to present global solutions for all main DACs Monotonicity should not only be guaranteed by the architecture of the calibration DAC 19, but also with the quantization of the arithmetic. The DNL transitions related to the outputs of the calibration DAC 19 should be "smooth" between input codes. Assuming a +128 LSB INL error between two control points as a worst case condition, and assuming that there are 8 piecewise linear segments of 8192 codes and 9 control points, it needs to be ensured that no calibration DAC 19 increment larger than 0.125 LSBs is added between two consecutive input-codes. At steps of 0.125 LSBs, 1024 steps are required to correct a 128 LSB INL error. Therefore, only the three last LSBs of the main DAC 17 input word is not needed. In other words, at least 3+10=13 MSBs should be used to guarantee step sizes not larger than 0.125 LSBs at the output. With some margin, 14 MSBs are needed to represent the input code and the control point "X" axes to the digital circuit. These constitute design choices on a specific main DAC 19, and are not intended to present global solutions for all main DACs Re-writing the Equation 1 to reflect the arithmetic quantization, we get Equation 2:

[0050]

$$\text{Cal\_dac\_out}_{12MSB_s} = Y_{17MSB_s} + \left( \frac{(Y_{i+1}-Y_i)_{8MSB_s}}{((C_{i+1}-C_i)_{14MSB_s}} (C_i - C_k)_{14MSB_s} \right)_{11MSB_s}$$

It should be noted that since each segment is of length 8192, and since the last two LSBs of 16 bits have been ignored, the division is an arithmetic right shift by 13–2=11 bits. The equation is left aligned. The subscript XMSBs means that X most significant digits are used in the arithmetic.

Thus, the calibration DAC 19 uses seven bits of reference scaling and 12 bits of segmented R–2R. That is, the calibration DAC 19 has 19 bits of resolution and eight bit equivalent full-scale error. The eight bit equivalent full-scale error comes from the inaccuracy of reference scaling. The first seven bits are obtained by scaling the range by a factor of 128. This is twice the range required to correct for worst case INL. The full-scale inaccuracy of the calibration DAC 19 can be measured and corrected within this range. The remaining 12-bits is an R–2R (or a partially segmented R–2R) type of DAC.

Since the signal at the output of the calibration DAC 19 is of small value, the noise that is generated from the summing circuit may be of significant magnitude. It is necessary to make sure that the circuit noise is not more than the 16-bit level. For low power consumption, the input and the feedback resistors of the summing amplifier should be in the order of 10 K ohms. 4 KTRF noise is then 4.031 uV rms (24.18 uV peak) for 100 KHz bandwidth. The exact calculation of the noise and feedback resistor values, of course, should be determined for each particular application.

Once the control points have been established and the fuses blown, the tester is removed from the circuit, and the control functions are operated by a controller circuit 50, shown in the circuit 15' in FIG. 5. The controller circuit 50 determines the pair of control points between which the arbitrary input code word $C_k$ lies and selects the appropriate register 23 . . . 25 to enable the corresponding INL value to be interpolated. Thus, the controller circuit 50 receives as input the arbitrary input word to the main DAC 17. It also receives as another input the X-axis values of the code words established by the tester, as described above. The two outputs define the register containing the INL values between the control words selected.

Figure 6:
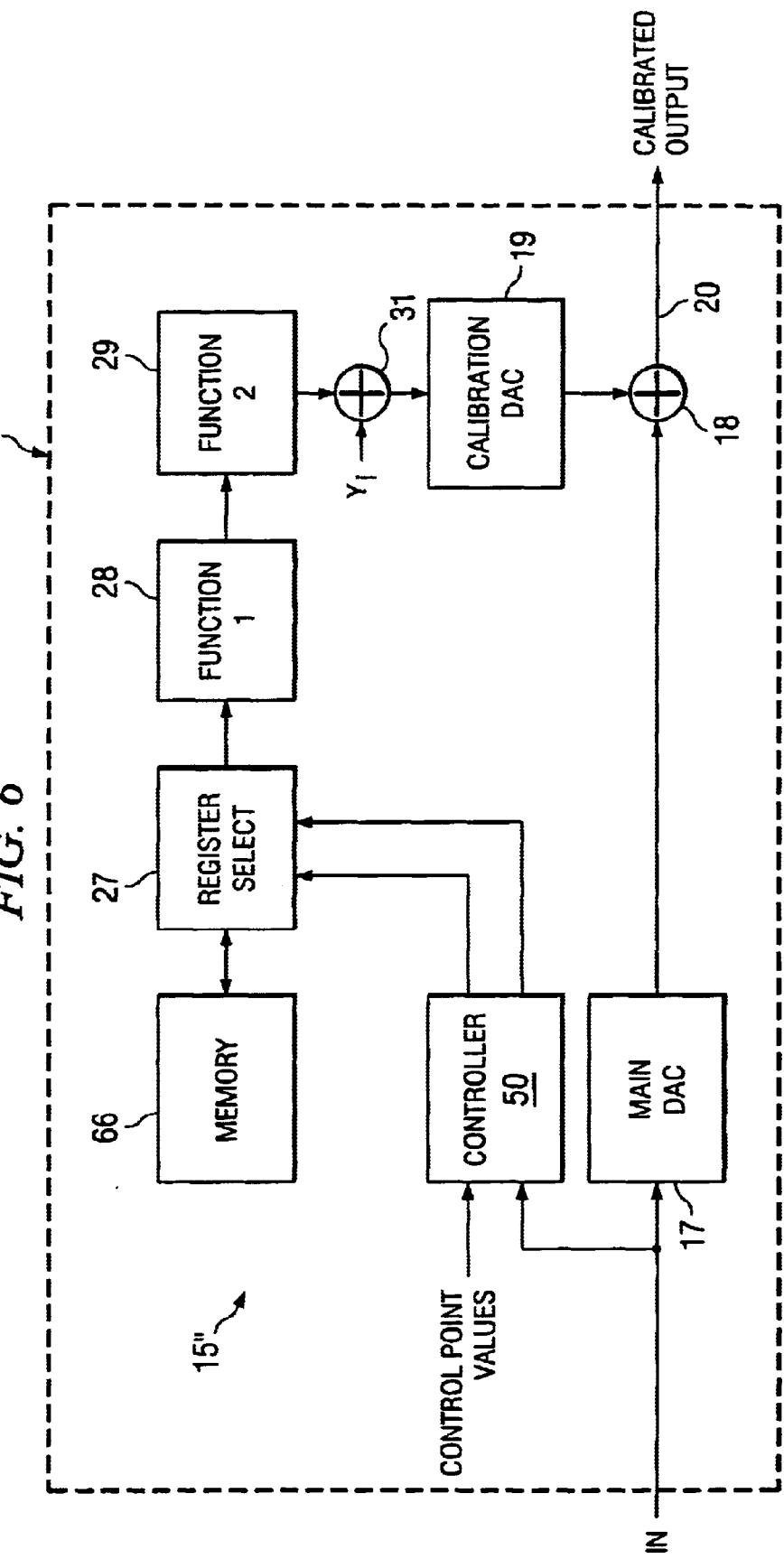
FIG. 6 is a block diagram of an alternative embodiment of a calibrated DAC architecture, in accordance with a preferred embodiment of the invention.

As mentioned, the specific implementation described above has eight piecewise linear segments requiring 9 control points, each control point has eight bits representing the Y-axis INL values. The x-axis locations of these control points may be fixed, as described above (although, of course, they do not necessarily have to be fixed) at DAC input codes, 0, 8192, 2x8192, 3x8192, . . . 7x8192, 8x8192. The flow-chart implemented b the control circuit 50, therefore, is as follows: define 3 most significant bits of the DAC input as Adefine 9 8-bit control points as: control0<7:0>, control1<7:0>, control2<7:0>, control3<7:0>, control4<7:0>, control5<7:0>, control6<7:0>, control7<7:0>, control8<7:0>, inputs are: A, control0<7:0>, control1<7:0>, control2<7:0>, control3<7:0>, control4<7:0>, control5<7:0>, control6<7:0>, control7<7:0>, control8<7:0>outputs are: out1<7:0>, out2<7:0> FLOWCHART:if(A==000), out1<7:0>=control0<7:0>, out2<7:0>=control1<7:0>if(A==001), out1<7:0>=control1<7:0>, out2<7:0>=control2<7:0>if (A==010), out1<7:0>=control2<7:0>, out2<7:0>=control3<7:0>if(A==011), out1<7:0>=control3<7:0>, out2<7:0>=control4<7:0>if(A==100), out1<7:0>=control4<7:0>, out2<7:0>=control5<7:0>if(A==101), out1<7:0>=control5<7:0>, out2<7:0>=control6<7:0>if (A==110), out1<7:0>=control6<7:0>, out2<7:0>=control7<7:0>if(A==111), out1<7:0>=control7<7:0>, out2<7:0>=control8<7:0>Although the circuit embodiment of FIGS. 1 and 5 are constructed using fuse links, other types of memory elements may be equally advantageously employed. For example, as shown in FIG. 6, the DAC circuit 15" includes memory elements that are provided by more traditional memory devices, such as, for example, EEPROM, flash memory, laser trim links, etc. Additionally, the main DAC 17 may be provided by any suitable DAC structure, such as, for example, a segmented DAC 17', or the like. The segmented DAC 17' may be, for example, a segmented R–2R segmented DAC, a segmented current steering DAC, a segmented voltage out DAC, or the like.

Figure 7:
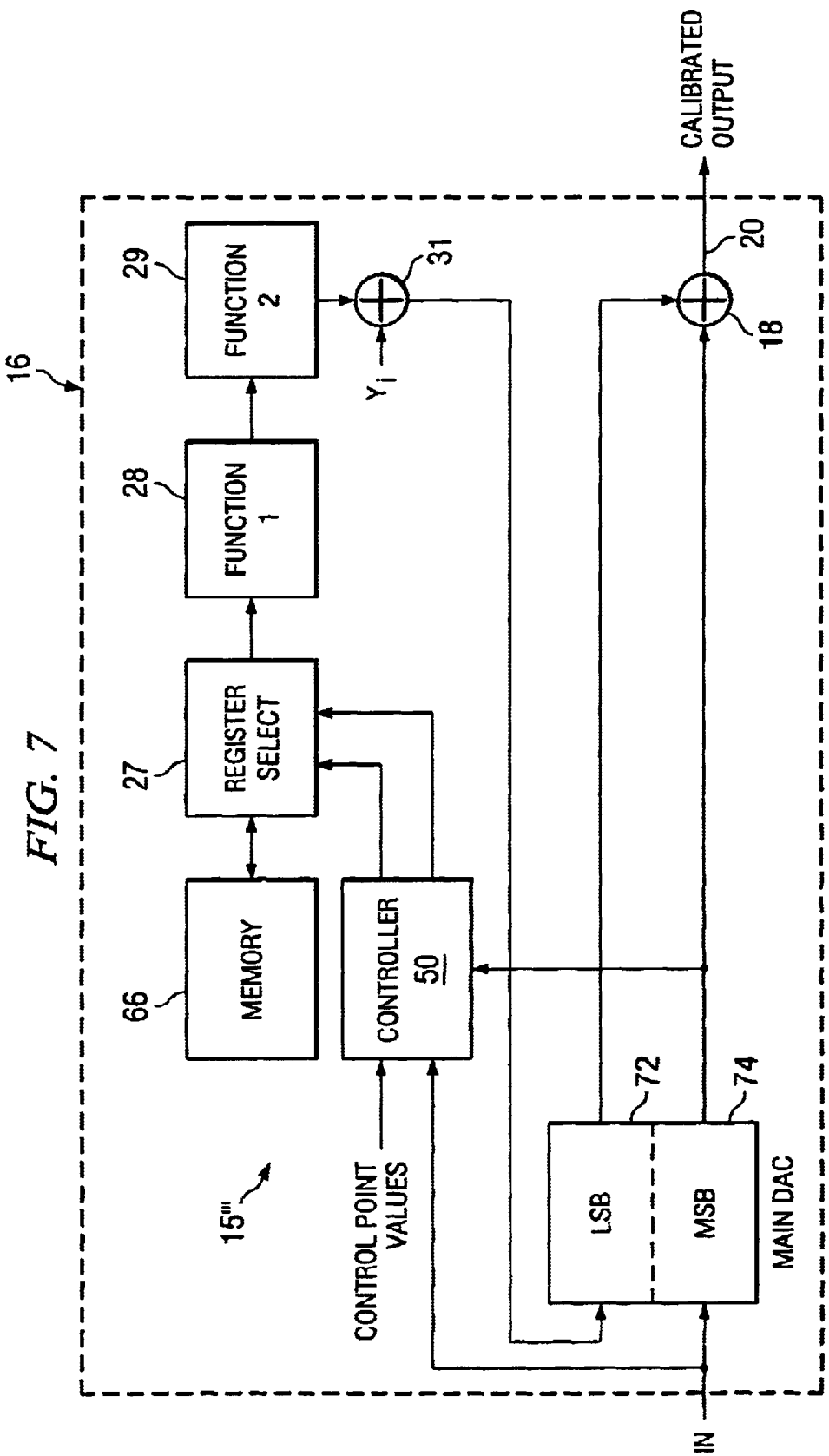
FIG. 7 is a block diagram of another alternative embodiment of a compensated DAC architecture, in accordance with a preferred embodiment of the invention.

Finally, it should be noted that the calibration DAC 19 may be incorporated into a portion of the main DAC 17, as shown in the circuit 15'" in FIG. 7. In the embodiment shown in FIG. 7, for example, the LSB portion 74 of the main DAC 72 is used as the calibration DAC 19, receiving its input from the output of the offset value adder 31. The MSB portion 74 of the main DAC 72 then receives its input in the same manner as the main DAC 17 in the circuit embodiments of FIGS. 2, 5, and 6 above. In this scheme, the entire calibration can be done in the digital domain.

The actual design of the circuit functions herein described can be constructed or realized through the use of software tools for integrated circuit design. Such software tools are often referred to as high-level description language (HDL) or Very High Speed Integrated Circuit Hardware Description Language (VHSIC HDL or VHDL) design tools. Such software tools can transform circuit definitions, specifications, and functions into integrated circuit hardware, without a need to specify any particular hardware implementation, layout, or design. Examples of such software tools are the design compiler available from Synopsys, Inc. of Mountain View, Calif., the Behavior to Structure Translator (BEST) synthesis tool developed by Unisys Corporation, the DesignBook Synthesis tool from Escalade, and the Synergy synthesis tool available from Cadence Design Systems, Inc. A VHDL code by which one embodiment of the DAC circuit of the invention can be constructed is set forth in Appendix A, preceding the claims herein.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

APPENDIX A

VHDL LISTING

CODE 1—This block is a 8 bit register used for storing Y values (INL values)

library IEEE;use IEEE.Std_Logic_1164.all;use IEEE.Std_Logic_Unsigned.all;

—The entity is called memoryentity memory isport(clk, resetn:in std_logic;

Data_in:in std_logic_vector(6 downto 0);Data_out:out std_logic_vector(6 downto 0));end memory;architecture RTL of memory isbeginprocess(clk,resetn)beginif resetn='0' thenData_out<=(others=>'0');elsif clk'event and clk='1' thenData_out<=Data_in;end if;end process;end;

CODE 2—This is the test bench for 8 bit register library IEEE;use IEEE.Std_Logic_1164.all;use IEEE.Std_Logic_Unsigned.all;entity T_memory isend T_memory;architecture TEST of T_memory is component memory port (clk,resetn:in std_logic;Data_in:in std_logic_vector(6 downto 0);Dataout:out std_logic_vector(6 downto 0)); end component;signal clk,resetn:std_logic;signal Data_in, Data_out:std_logic_vector (6 downto 0);

begin - - -

—Instantiate UUT

- - -

UUT:memory port map (clk,resetn,Data_in,Data_out);

- - -

—Stimulus:

- - -

—STIMULUS:process
begin

—Initially reset is HIGH and CLK is LOWData_in<= "0010100";resetn<='1';clk<='0';wait for 5 ns;—On the Rising edge of CLK, Data_in should be transferred to Data_outclk<='1';wait for 5 ns;—More inputs are triedData_in<="1010111";clk<='0';wait for 1 ns;clk<='1';wait for 4 ns;Data_in<="1011110";clk<= '0';wait for 1 ns;clk<='1';wait for 2 ns;—Reset function is checked by making it asynchronously ZERO— Also CLK is made zero so that data can be captured on next rising edge resetn<='0';clk<='0';wait for 3 ns;resetn<='1';wait for 1 ns;Data_in<= "1100000";wait for 2 ns;clk<='1';wait for 2 ns;Data_in<="0101010";clk<='0';wait for 5 ns;clk<='1';wait; end process STIMULUS;end TEST;

- - -

Configuration . . .

- - - configuration CFG_T_memory of T_memory is for TEST end for;end CFG_T_memory;

CODE 3 module memory (clk, resetn, Data_in, Data_out);output [6:0] Data_out;input [6:0] Data_in;input clk, resetn; dffr \Data_out_reg[6] (.Q(Data_out[6]), .CLK(clk), .D(Data_in[6]), .RST(resetn)); dffr \Data_out_reg[5] (.Q(Data_out[5]), .CLK(clk), .D(Data_in[5]), .RST(resetn)); dffr \Data_out_reg[4] (.Q(Data_out[4]), .CLK(clk), .D(Data_in[4]), .RST(resetn)); dffr \Data_out_reg[3] (.Q(Data_out[3]), .CLK(clk), .D(Data_in[3]), .RST(resetn)); dffr \Data_out_reg[2] (.Q(Data_out[2]), .CLK(clk), .D(Data_in[2]), .RST(resetn)); dffr \Data_out_reg[1] (.Q(Data_out[1]), .CLK(clk), .D(Data_in[1]), .RST(resetn)); dffr \Data_out_reg[0] (.Q(Data_out[0]), .CLK(clk), .D(Data_in([0]), .RST(resetn));endmodule CODE 4—This represents the control block, which decides Yi+1 and Yi based on input library IEEE;use IEEE.Std_Logic_1164.all;use IEEE.Std_Logic_Unsigned.all;entity control isport (clock,reset:in std_logic;msb:in std.logic_vector(2 downto 0);datain1,datain2,datain3,datain4,datain5:in std_logic_vector(6 downto 0);datain6,datain7, datain8,datain9:in std_logic_vector(6 downto 0);out1:out std_logic_vector(6 downto 0);out2:out std_logic_vector(6 downto 0));end control;architecture RTL of control iscomponent memoryport(clk, resetn:in std_logic; Data_in:in std_logic_vector(6 downto 0); Data_out:out std_logic_vector(6 downto 0));end component;signaldataout1,dataout2,dataout3, dataout4,dataout5:std_logic_vector(6 downto 0);signaldataout6,dataout7,dataout8,dataout9:std_logic_vector(6 downto 0);beginregister1:memory port map(clock,reset,datain1,dataout1);register2:memory port map(clock,reset,datain2,dataout2);register3:memory port map(clock,reset,datain3, dataout3);register4:memory port map(clock,reset, datain4,dataout4);register5:memory port map(clock, reset,datain5,dataout5);register6:memory port map (clock,reset,datain6,dataout6);register7:memory port map(clock,reset,datain7,dataout7);register8:memory port map(clock,reset,datain8,dataout8) ;register9:memory port map(clock,reset,datain9, dataout9);process (msb,dataout1,dataout2,dataout3, dataout4,dataout5,dataout6,dataout7,dataout8, dataout9) begincase msb iswhen "000"=>out1<= dataout1; out2<=dataout2;when "001"=>out1<= dataout2; out2<=dataout3;when "010"=>out1<= dataout3; out2<=dataout4;when "011"=>out1<= dataout4; out2<=dataout5;when "100"=>out1<= dataout5; out2<=dataout6;when "101"=>out1<= dataout6; out2<=dataout7;when "110"=>out1<= dataout7; out2<=dataout8;when "111"=>out1<= dataout8; out2<=dataout9;when others=>out1<= dataout1;out2<=dataout2;end case;end process;end;

CODE 5—This is the test bench for control blocklibrary IEEE;use IEEE.Std_Logic_1164.all;

use IEEE.Std_Logic_Unsigned.all;entity T_control isend T_control;architecture TEST of T_control is component control port (clock,reset:in std_logic;msb:in std_logic_vector(2 downto 0);datain1, datain2,datain3,datain4,datain5:in std_logic_vector(6 downto 0);datain6,datain7,datain8,datain9:in std_logic_vector(6 downto 0);out1:out std_logic_vector(6 downto 0);out2:out std_logic_vector(6 downto 0)); end component;signal msb:std_logic_vector(2 downto 0);signal clock,reset:std_logic;signal datain1,datain2,datain3,datain4,datain5,out1,out2:std_logic_vector(6 downto 0);signal datain6,datain7, datain8,datain9:std_logic_vector(6 downto 0);begin

- - -

—Instantiate UUT

- - -

UUT:control port map (clock,reset,msb,datain1,datain2, datain3,datain4,datain5,datain6,datain7,datain8, datain9,out1

---
—Stimulus:
---
STIMULUS:process
begindatain1<="0000000";datain2<=
"0111111";datain3<="1000000";reset<='1';msb>=
"000 for 3 ns;clock<='1';wait for 5 ns;msb<=
"001";wait for 5 ns;msb<="111";wait for 5 ns;>="0
---
Configuration . . .
---
configuration CFG_T_control of T_control is for TEST end for;end CFG_T_control;

CODE 6

```
module memory_0 (clk, resetn, Data_in, Data_out)
;output [6:0] Data_out;input [6:0] Data_in;input clk,
resetn; dffr \Data_out_reg[6] (.Q(Data_out[6]), .CLK
(clk), .D(Data_in[6]), .RST(resetn)); dffr \Data_out_
reg[5] (.Q(Data_out[5]), .CLK(clk), .D(Data_in[5]),
.RST(resetn)); dffr \Data_out_reg[4] (.Q(Data_out
[4]), .CLK(clk), .D(Data_in[4]), .RST(resetn)); dffr
\Data_out_reg[3] (.Q(Data_out[3]), .CLK(clk),
.D(Data_in[3]), .RST(resetn)); dffr \Data_out_reg[2]
(.Q(Data_out[2]), .CLK(clk), .D(Data_in[2]), .RST
(resetn)); dffr \Data_out_reg[1] (.Q(Data_out[1]),
.CLK(clk), .D(Datai n [1]), .RST(resetn)); dffr \Data_
out_reg[0] (.Q(Data_out[0]), .CLK(clk), .D(Data_in
[0]), .RST(resetn));endmodule module memory_1 (clk, resetn, Data_in, Data_out)
;output [6:0] Data_out;input [6:0] Data_in;input clk,
resetn; dffr \Data_out_reg[6] (.Q(Data_out[6]), .CLK
(clk), .D(Data_in[6]), .RST(resetn)); dffr \Data_out_
reg[5] (.Q(Data_out[5]), .CLK(clk), .D(Data_in[5]),
.RST(resetn)); dffr \Data_out_reg[4] (.Q(Data_out
[4]), .CLK(clk), .D(Data_in[4]), .RST(resetn)); dffr
\Data_out_reg[3] (.Q(Data_out[3]), .CLK(clk),
.D(Data_in[3]), .RST(resetn)); dffr \Data_out_reg[2]
(.Q(Data_out[2]), .CLK(clk), .D(Data_in[2]), .RST
(resetn)); dffr \Data_out_reg[1] (.Q(Data_out[1]),
.CLK(clk), .D(Data_in[1]), .RST(resetn)); dffr \Data_
out_reg[0] (.Q(Data_out[0]), .CLK(clk), .D(Data_in
[0]), .RST(resetn));endmodule module memory_2 (clk, resetn, Data_in, Data_out)
;output [6:0] Data_out;input [6:0] Data_in;input clk,
resetn; dffr \Data_out_reg[6] (.Q(Data_out[6]), .CLK
(clk), .D(Data_in[6]), .RST(resetn)); dffr \Data_out_
reg[5] (.Q(Data_out[5]), .CLK(clk), .D(Data_in[5]),
.RST(resetn)); dffr \Data_out_reg[4] (.Q(Data_out
[4]), .CLK(clk), .D(Data_in[4]), .RST(resetn)); dffr
\Data_out_reg[3] (.Q(Data_out[3]), .CLK(clk),
.D(Data_in[3]), .RST(resetn)); dffr \Data_out_reg[2]
(.Q(Data_out[2]), .CLK(clk), .D(Data_in[2]), .RST
(resetn)); dffr \Data_out_reg[1] (.Q(Data_out[1]),
.CLK(clk), .D(Data_in[1]), .RST(resetn)); dffr \Data_
out_reg[0] (.Q(Data_out[0]), .CLK(clk), .D(Data_in
[0]), .RST(resetn));endmodule module memory_3 (clk, resetn, Data_in, Data_out)
;output [6:0] Data_out;input [6:0] Data_in;input clk,
resetn; dffr \Data_out_reg[6] (.Q(Data_out[6]), .CLK
(clk), .D(Data_in[6]), .RST(resetn)); dffr \Data_out_
reg[5] (.Q(Data_out[5]), .CLK(clk), .D(Data_in[5]),
.RST(resetn)); dffr \Data_out_reg[4] (.Q(Data_out
[4]), .CLK(clk), .D(Data_in[4]), .RST(resetn)); dffr
\Data_out_reg[3] (.Q(Data_out[3]), .CLK(clk),
.D(Data_in[3]), .RST(resetn)); dffr \Data_out_reg[2]
(.Q(Data_out[2]), .CLK(clk), .D(Data_in[2]), .RST
(resetn)); dffr \Data_out_reg[1] (.Q(Data_out[1]),
.CLK(clk), .D(Data_in[1]), .RST(resetn)); dffr \Data_
out_reg[0] (.Q(Data_out[0]), .CLK(clk), .D(Data_in
[0]), .RST(resetn));endmodule module memory_4 (clk, resetn, Data_in, Data_out)
;output [6:0] Data_out;input [6:0] Data_in;input clk,
resetn; dffr \Data_out_reg[6] (.Q(Data_out[6]), .CLK
(clk), .D(Data_in[6]), .RST(resetn)); dffr \Data_out_
reg[5] (.Q(Data_out[5]), .CLK(clk), .D(Data_in[5]),
.RST(resetn)); dffr \Data_out_reg[4] (.Q(Data_out
[4]), .CLK(clk), .D(Data_in[4]), .RST(resetn)); dffr
\Data_out_reg[3] (.Q(Data_out[3]), .CLK(clk),
.D(Data_in[3]), .RST(resetn)); dffr \Data_out_reg[2]
(.Q(Data_out[2]), .CLK(clk), .D(Data_in[2]), .RST
(resetn)); dffr \Data_out_reg[1] (.Q(Data_out[1]),
.CLK(clk), .D(Data_in[1]), .RST(resetn)); dffr \Data_
out_reg[0] (.Q(Data_out[0]), .CLK(clk), .D(Data_in
[0]), .RST(resetn));endmodule module memory_5 (clk, resetn, Data_in, Data_out)
;output [6:0] Data_out;input [6:0] Data_in;input clk,
resetn; dffr \Data_out_reg[6] (.Q(Data_out[6]), .CLK
(clk), .D(Data_in[6]), .RST(resetn)); dffr \Data_out_
reg[5] (.Q(Data_out[5]), .CLK(clk), .D(Data_in[5]),
.RST(resetn)); dffr \Data_out_reg[4] (.Q(Data_out
[4]), .CLK(clk), .D(Data_in[4]), .RST(resetn)); dffr
\Data_out_reg[3] (.Q(Data_out[3]), .CLK(clk),
.D(Data_in[3]), .RST(resetn)); dffr \Data_out_reg[2]
(.Q(Data_out[2]), .CLK(clk), .D(Data_in[2]), .RST
(resetn)); dffr \Data_out_reg[1] (.Q(Data_out[1]),
.CLK(clk), .D(Data_in[1]), .RST(resetn)); dffr \Data_
out_reg[0] (.Q(Data_out[0]), .CLK(clk), .D(Data_in
[0]), .RST(resetn));endmodule module memory_6 (clk, resetn, Data_in, Data_out)
;output [6:0] Data_out;input [6:0] Data_in;input clk,
resetn; dffr \Data_out_reg[6] (.Q(Data_out[6]), .CLK
(clk), .D(Data_in[6]), .RST(resetn)); dffr \Data_out_
reg[5] (.Q(Data_out[5]), .CLK(clk), .D(Data_in[5]),
.RST(resetn)); dffr \Data_out_reg[4] (.Q(Data_out
[4]), .CLK(clk), .D(Data_in[4]), .RST(resetn)); dffr
\Data_out_reg[3] (.Q(Data_out[3]), .CLK(clk),
.D(Data_in[3]), .RST(resetn)); dffr \Data_out_reg[2]
(.Q(Data_out[2]), .CLK(clk), .D(Data_in[2]), .RST
(resetn)); dffr \Data_out_reg[1] (.Q(Data_out[1]),
.CLK(clk), .D(Data_in[1]), .RST(resetn)); dffr \Data_
out_reg[0] (.Q(Data_out[0]), .CLK(clk), .D(Data_in
[0]), .RST(resetn));endmodule module memory_7 (clk, resetn, Data_in, Data_out)
;output [6:0] Data_out;input [6:0] Data_in;input clk,
resetn; dffr \Data_out_reg[6] (.Q(Data_out[6]), .CLK
(clk), .D(Data_in[6]), .RST(resetn)); dffr \Data_out_
reg[5] (.Q(Data_out[5]), .CLK(clk), .D(Data_in[5]),
.RST(resetn)); dffr \Data_out_reg[4] (.Q(Data_out
[4]), .CLK(clk), .D(Data_in[4]), .RST(resetn)); dffr
\Data_out_reg[3] (.Q(Data_out[3]), .CLK(clk),
.D(Data_in[3]), .RST(resetn)); dffr \Data_out_reg[2]
(.Q(Data_out[2]), .CLK(clk), .D(Data_in[2]), .RST
(resetn)); dffr \Data_out_reg[1] (.Q(Data_out[1]),
.CLK(clk), .D(Data_in[1]), .RST(resetn)); dffr \Data_
out_reg[0] (.Q(Data_out[0]), .CLK(clk), .D(Data_in
[0]), .RST(resetn));endmodule module memory_8 (clk, resetn, Data_in, Data_out)
;output [6:0] Data_out;input [6:0] Data_in;input clk,
resetn; dffr \Data_out_reg[6] (.Q(Data_out[6]), .CLK
(clk), .D(Data_in[6]), .RST(resetn)); dffr \Data_out_
reg[5] (.Q(Data_out[5]), .CLK(clk), .D(Data_in[5]),
```

.RST(resetn)); dffr \Data_out_reg[4] (.Q(Data_out[4]), .CLK(clk), .D(Data_in[4]), .RST(resetn)); dffr \Data_out_reg[3] (.Q(Data_out[3]), .CLK(clk), .D(Data_in[3]), .RST(resetn)); dffr \Data_out_reg[2] (.Q(Data_out[2]), .CLK(clk), .D(Data_in[2]), .RST (resetn)); dffr \Data_out_reg[1] (.Q(Data_out[1]), .CLK(clk), .D(Data_in[1]), .RST(resetn)); dffr \Data_out_reg[0] (.Q(Data_out[0]), .CLK(clk), .D(Data_in[0]), .RST(resetn));endmodule module control (clock,reset,msb,datain1,datain2,datain3, datain4,datain5,datain6,datain7,datain8,datain9,out1, out2);input [6:0]datain7;input [6:0] datain9;input [6:0] datain6;input [6:0] datain8;output [6:0] out1;input [2:0] msb;input [6:0] datain1;input [6:0] datain3;input [6:0] datain4;input [6:0] datain2;input [6:0] datain5;output [6:0] out2;input clock, reset; wire \dataout1[5], \dataout1[3], \dataout2[0], \dataout7[4], \dataout9[2], \dataout2[6], \dataout2[4], \dataout4[3], \dataout7[0], \dataout9[6], \dataout1[1], \dataout4[1], \dataout9[4], \dataout7[2], \dataout2[2], \dataout4[5], \dataout7[6], \dataout9[0], \dataout3[6], \dataout3[2], \dataout5[1], \dataout6[2], \dataout8[4], \dataout5[5], \dataout8[0], \dataout6[6], \dataout6[4], \dataout1[6], \dataout1[4], \dataout1[0], \dataout8[2], \dataout3[4], \dataout3[0], \dataout5[3], \dataout8[6], \dataout6[0], \dataout3[5], \dataout5[2], \dataout6[1], \dataout5[6], \dataout6[5], \dataout8[3], \dataout3[3], \dataout3[1], \dataout8[1], \dataout5[4], \dataout2[3], \dataout5[0], \dataout6[3], \dataout8[5], \dataout4[4], \dataout9[1], \dataout2[5], \dataout4[2], \dataout4[0], \dataout7[3], \dataout9[5], \dataout7[1], \dataout1[2], \dataout4[6], \dataout9[3], \dataout7[5], \dataout2[1], n8, n9, n10, n11, n12, n13, n14, n15, n16, n17, n18, n19, n20, n21, n22, n23, n24, n25, n26, n27, n28, n29, n30, n31, n32, n33, n34, n35, n36, n37, n38, n39, n40, n41, n42, n43, n44, n45, n46, n47, n48, n49, n50, n51, n52, n53; memory_8 register1 (.clk(clock), .resetn(reset), .Data_in(datain1), .Data_out({\dataout1[6], \dataout1[5], \dataout1[4], \dataout1[3], \dataout1[2], \dataout1[1], \dataout1[0]})); memory_7 register2 (.clk(clock), .resetn(reset), .Data_in(datain2), .Data_out({\dataout2[6], \dataout2[5], \dataout2[4], \dataout2[3], \dataout2[2], \dataout2[1], \dataout2[0]})); memory_6 register3 (.clk(clock), .resetn(reset), .Data_in(datain3), .Data_out({\dataout3[6], \dataout3[5], \dataout3[4], \dataout3[3], \dataout3[2], \dataout3[1], \dataout3[0]})); memory_5 register4 (.clk(clock), .resetn(reset), .Data_in(datain4), .Data_out({\dataout4[6], \dataout4[5], \dataout4[4], \dataout4[3], \dataout4[2], \dataout4[1], \dataout4[0]})); memory_4 register5 (.clk(clock), .resetn(reset), .Data_in(datain5), .Data_out({\dataout5[6], \dataout5[5], \dataout5[4], \dataout5[3], \dataout5[2], \dataout5[1], \dataout5[0]})); memory_3 register6 (.clk(clock), .resetn(reset), .Data_in(datain6), .Data_out({\dataout6[6], \dataout6[5], \dataout6[4], \dataout6[3], \dataout6[2], \dataout6[1], \dataout6[0]})); memory_2 register7 (.clk(clock), .resetn(reset), .Data_in(datain7), .Data_out({\dataout7[6], \dataout7[5], \dataout7[4], \dataout7[3], \dataout7[2], \dataout7[1], \dataout7[0]})); memory_1 register9 (.clk(clock), .resetn(reset), .Data_in(datain9), .Data_out({\dataout9[6], \dataout9[5], \dataout9[4], \dataout9[3], \dataout9[2], \dataout9[1], \dataout9[0]})); memory_0 register8 (.clk(clock), .resetn(reset), .Data_in(datain8), .Data_out({\dataout8[6], \dataout8[5], \dataout8[4], \dataout8[3], \dataout8[2], \dataout8[1], \dataout8[0]})); buf3 U10 (.Y(n8), .A(n49)); buf3 U11 (.Y(n9), .A(n50)); buf3 U12 (.Y(n10), .A(n48)); buf3 U13 (.Y(n11), .A(n51)); buf3 U14 (.Y(n12), .A(n47)); buf3 U15 (.Y(n13), .A(n52)); buf3 U16(.Y(n14), .A(n46)); buf3 U17 (.Y(n15), .A(n53)); nand21 U18 (.Y(out1[0]), .A(n16), .B(n17)); nand21 U19 (.Y(out1[1]), .A(n18), .B(n19)); nand21 U20 (.Y(out1[2]), .A(n20), .B(n21)); nand21 U21 (.Y(out1[3]), .A(n22), .B(n23)); nand21 U22 (.Y(out1[4]), .A(n24), .B(n25)); nand21 U23 (.Y(out1[5]), .A(n26), .B(n27)); nand21 U24 (.Y(out1[6]), .A(n28), .B(n29)); nand21 U25 (.Y(out2[0]), .A(n30), .B(n31)); nand21 U26 (.Y(out2[1]), .A(n32), .B(n33)); nand21 U27 (.Y(out2[2]), .A(n34), .B(n35)); nand21 U28 (.Y(out2[3]), .A(n36), .B(n37)); nand21 U29 (.Y(out2[4]), .A(n38), .B(n39)); nand21 U30 (.Y(out2[5]), .A(n40), .B(n41)); nand21 U31 (.Y(out2[6]), .A(n42), .B(n43)); inv1 U32 (.Y(n44), .A(msb[0])); inv1 U33 (.Y(n45), .A(msb[1])); and31 U34 (.Y(n46), .A(msb[1]), .B(msb[0]), .C(msb[2])); and31 U35 (.Y(n47), .A(msb[1]), .B(n44), .C(msb[2])); and31 U36 (.Y(n48), .A(msb[0]), .B(n45), .C(msb[2])); and31 U37 (.Y(n49), .A(n44), .B(n45), .C(msb[2])); nor31 U38 (.Y(n50), .A(n44), .B(msb[2]), .C(n45)); nor31 U39 (.Y(n51), .A(msb[0]), .B(msb[2]), .C(n45)); nor31 U40 (.Y(n52), .A(msb[1]), .B(msb[2]), .C(n44)); nor31 U41 (.Y(n53), .A(msb[1]), .B(msb[2]), .C(msb[0])); aoi2222 U42 (.Y(n43), .A(n46), .B(\dataout9[6]), .C(n47), .D(\dataout8[6]), .E(n48), .F(\dataout7[6]), .G(n49), .H(\dataout6[6])); aoi2222 U43 (.Y(n42), .A(n50), .B(\dataout5[6]), .C(n51), .D(\dataout4[6]), .E(n52), .F(\dataout3[6]), .G(n53), .H(\dataout2[6])); aoi2222 U44 (.Y(n41), .A(\dataout9[5]), .B(n46), .C(\dataout8[5]), .D(n47), .E(\dataout7[5]), .F(n48), .G(\dataout6[5]), .H(n49)); aoi2222 U45 (.Y(n40), .A(\dataout5[5]), .B(n50), .C(\dataout4[5]), .D(n51), .E(\dataout3[5]), .F(n52), .G(\dataout2[5]), .H(n53)); aoi2222 U46 (.Y(n39), .A(\dataout9[4]), .B(n46), .C(\dataout8[4]), .D(n47), .E(\dataout7[4]), .F(n48), .G(\dataout6[4]), .H(n49)); aoi2222 U47 (.Y(n38), .A(\dataout5[4]), .B(n50), .C(\dataout4[4]), .D(n51), .E(\dataout3[4]), .F(n52), .G(\dataout2[4]), .H(n53)); aoi2222 U48 (.Y(n37), .A(\dataout9[3]), .B(n46), .C(\dataout8[3]), .D(n47), .E(\dataout7[3]), .F(n48), G(\dataout6[3]), .H(n49)); aoi2222 U49 (.Y(n36), .A(\dataout5[3]), .B(n50), .C(\dataout4[3]), .D(n51), .E(\dataout3[3]), .F(n52), .G(\dataout2[3]), .H(n53)); aoi2222 U50 (.Y(n35), .A(\dataout9[2]), .B(n46), .C(\dataout8[2]), .D(n47), .E(\dataout7[2]), .F(n48), .G(\dataout6[2]), .H(n49)); aoi2222 U51 (.Y(n34), .A(\dataout5[2]), .B(n50), .C(\dataout4[2]), .D(n51), .E(\dataout3[2]), .F(n52), .G(\dataout2[2]), .H(n53)); aoi2222 U52 (.Y(n33), .A(\dataout9[1]), .B(n46), .C(\dataout8[1]), .D(n47), .E(\dataout7[1]), .F(n48), .G(\dataout6[1]), H(n49)); aoi2222 U53 (.Y(n32), .A(\dataout5[1]), .B(n50), .C(\dataout4[1]), .D(n51), .E(\dataout3[1]), .F(n52), .G(\dataout2[1]), .H(n53)); aoi2222 U54 (.Y(n31), .A(\dataout9[0]), .B(n46), .C(\dataout8[0]), .D(n47), .E(\dataout7[0]), .F(n48), .G(\dataout6[0]), .H(n49)); aoi2222 U55 (.Y(n30), .A(\dataout5[0]), .B(n50), .C(\dataout4[0]), .D(n51), .E(\dataout3[0]), .F(n52), .G(\dataout2[0]), .H(n53)); aoi2222 U56 (.Y(n29), .A(\dataout8[6]), .B(n14), .C(\dataout7[6]), .D(n112), .E(\dataout6[6]), .F(n10), .G(\dataout5[6]), .H(n8)); aoi2222 U57 (.Y(n28), .A(\dataout4[6]), .B(n9), .C(\dataout3[6]), .D(n11), .E(\dataout2[6]), .F(n13), .G(\dataout1[6]), .H(n15)); aoi2222 U58 (.Y(n27), .A(\dataout8[5]), .B(n46), .C(\dataout7[5]), .D(n47), .E(\dataout6[5]), .F(n48), .G(\dataout5[5]), .H(n49));

aoi2222 U59 (.Y(n26), .A(\dataout4[5]), .B(n50), .C(\dataout3[5]), .D(n51), .E(\dataout2[5]), .F(n52), .G(\dataout1[5]), .H(n53); aoi2222 U60 (.Y(n25), .A(\dataout8[4]), .B(n14), .C(\dataout7[4]), .D(n12), .E(\dataout6[4]), .F(n10), .G(\dataout5[4]), .H(n8)); aoi2222 U61 (.Y(n24), .A(\dataout4[4]), .B(n9), .C(\dataout3[4]), .D(n11), .E(\dataout2[4]), .F(n13), .G(\dataout1[4]), .H(n15)); aoi2222 U62 (.Y(n23), .A(\dataout8[3]), .B(n46), .C(\dataout7[3]), .D(n47), .E(\dataout6[3]), .F(n48), .G(\dataout5[3]), .H(n49)); aoi2222 U63 (.Y(n22), .A(\dataout4[3]), .B(n50), .C(\dataout3[3]), .D(n51), .E(\dataout2[3]), .F(n52), .G(\dataout1[3]), .H(n53)); aoi2222 U64 (.Y(n21), .A(\dataout8[2]), .B(n46), .C(\dataout7[2]), .D(n47), .E(\dataout6[2]), .F(n48), .G(\dataout5[2]), .H(n49)); aoi2222 U65 (.Y(n20), .A(\dataout4[2]), .B(n50), .C(\dataout3[2]), .D(n51), .E(\dataout2[2]), .F(n52), .G(\dataout1[2]), .H(n53)); aoi2222 U66 (.Y(n19), .A(\dataout8[1]), .B(n46), .C(\dataout7[1]), .D(n47), .E(\dataout6[1]), .F(n48), .G(\dataout5[1]), .H(n49)); aoi2222 U67 (.Y(n18), .A(\dataout4[1]), .B(n50), .C(\dataout3[1]), .D(n51), .E(\dataout2[1]), .F(n52), .G(\dataout1[1]), .H(n53)); aoi2222 U68 (.Y(n17), .A(\dataout8[0]), .B(n14), .C(\dataout7[0]), .D(n12), .E(\dataout6[0]), .F(n10), .G(\dataout5[0]), .H(n8)); aoi2222 U69 (.Y(n16), .A(\dataout4[0]), .B(n9), .C(\dataout3[0]), .D(n11), .E(\dataout2[0]), .F(n13), .G(\dataout1[0]), .H(n15));endmodule CODE 7—This block is a 8 bit subtractor—This block is used to evaluate Yi+1—Yilibrary IEEE;

use IEEE.Std_Logic_1164.all;use IEEE.Std_Logic_Unsigned.all;entity ADD8 isport (A,B:in std_logic_vector(7 downto 0);Sum: out std_logic_vector(7 downto 0));end ADD8;architecture RTL of ADD8 isbeginSum<=A–B;end;

CODE 8—This is the test bench for 8 bit adder/subtractor blocklibrary IEEE;

use IEEE.Std_Logic_1164.all;use IEEE.Std_Logic_Unsigned.all;entity T_ADD8 isend T_ADD8;architecture TEST of T_ADD8 is component ADD8 port (A,B:in std_logic_vector(7 downto 0); Sum:out std_logic_vector(7 downto 0)); end component;signal A,B:std_logic_vector(7 downto 0);signal Sum:std_logic_vector(7 downto 0);begin
- - -
Instantiate UUT
- - -
UUT:ADD8 port map (A,B,Sum);
- - -
Stimulus:
- - -
STIMULUS:
process beginA<="00000000";B<="00000000";wait for 10 ns;A<="00010100";B<="00001010";wait for 10 ns;A<="00001010";B<="00010100";wait for 10 ns;A<="11100111";B<="11100111";wait for 10 ns;A<="11100111";B<="00100011";wait for 10 ns;A<="11000000";B<="11000000";wait for 10 ns;A<="11000000";B<="00111111";wait; end process STIMULUS;end TEST;
- - -
Configuration . . .
- - -
configuration CFG_T_ADD8 of T_ADD8 is for TEST end for;end CFG_T_ADD8;

CODE 9 module ADD8_DW01_sub_8_0 (A, B, CI, DIFF, CO);input [7:0] A;input [7:0] B;output [7:0] DIFF;input CI;output CO; wire n50, n51, n52, n53, n54, n55, n56, n57, n58, n59, n60, n61, n62, n63, n64, n65, n66, n67, n68, n69, n70, n71, n72, n73, n74, n75, n76, n77, n78, n79, n80, n81, n82, n83, n84, n85, n86, n87; aoi12 U4 (.Y(n50), .A(n53), .B1(n51), .B2(n52)); oai12 U5 (.Y(DIFF[0]), .A(n55), .B1(B[0]), .B2(n54)); aoi12 U6 (.Y(n56), .A(n59), .B1(n57), .B2(n58)); nor21 U7 (.Y(n60), .A(n61), .B(n53)); nor21 U8 (.Y(n62), .A(n63), .B(n64)); nor21 U9 (.Y(n65), .A(n66), .B(n67)); nor21 U10 (.Y(n68), .A(n59), .B(n69)); xor21 U11 (.Y(DIFF[6]), .A(n60), .B(n51)); xnor21 U12 (.Y(DIFF[4]), .A(n62), .B(n70)); xor21 U13 (.Y(DIFF[3]), .A(n65), .B(n71)); xnor21 U14 (.Y(DIFF[2]), .A(n68), .B(n72)); xnor21 U15 (.Y(DIFF[1]), .A(n55), .B(n73)); inv1 U16 (.Y(n74), .A(B[6])); inv1 U17 (.Y(n75), .A(B[4])); inv1 U18 (.Y(n76), .A(B[2])); inv1 U19 (.Y(n77), .A(A[1])); inv1 U20 (.Y(n78), .A(A[3])); inv1 U21 (.Y(n79), .A(A[5])); inv1 U22 (.Y(n54), .A(A[0])); xor31 U23 (.Y(DIFF[7]), .A(n50), .B(B[7]), .C(A[7])); xnor31 U24 (.Y(DIFF[5]), .A(n80), .B(A[5]), .C(B[5])); oai12 U25 (.Y(n80), .A(n81), .B1(n63), .B2(n70)); nand21 U26 (.Y(n81), .A(A[4]), .B(n75)); inv1 U27 (.Y(n64), .A(n81)); and21 U28 (.Y(n67), .A(B[3]), .B(n78)); and21 U29 (.Y(n72), .A(n58), .B(n57)); or21 U30 (.Y(n57), .A(n77), .B(B[1])); nand21 U31 (.Y(n82), .A(A[2]), .B(n76)); inv1 U32 (.Y(n69), .A(n82)); oai12 U33 (.Y(n71), .A(n82), .B1(n59), .B2(n72)); and21 U34 (.Y(n53), .A(A[6]), .B(n74)); nor21 U35 (.Y(n66), .A(n78), .B(B[3])); nor21 U36 (.Y(n59), .A(n76), .B(A[2])); nand21 U37 (.Y(n55), .A(B[0]), .B(n54)); nand21 U38 (.Y(n83), .A(B[1]), .B(n77)); nand21 U39 (.Y(n58), .A(n55), .B(n83)); aoi12 U40 (.Y(n84), .A(n67), .B1(n85), .B2(n82)); nor21 U41 (.Y(n70), .A(n66), .B(n84)); nor21 U42 (.Y(n63), .A(n75), .B(A[4])); oai12 U43 (.Y(n86), .A(n80), .B1(A[5]), .B2(n87)); oai12 U44 (.Y(n51), .A(n86), .B1(B[5]), .B2(n79)); nor21 U45 (.Y(n61), .A(n74), .B(A[6])); inv1 U46 (.Y(n52), .A(n61)); nand21 U47 (.Y(n73), .A(n57), .B(n83)); inv1 U48 (.Y(n85), .A(n56)); inv1 U49 (.Y(n87), .A(B[5]));endmodule module ADD8 (A, B, Sum);input [7:0] A;input [7:0] B;output [7:0] Sum; ADD8_DW01_sub_8_0 \sub_18/minus/minus (.A(A), .B(B), .CI(1'b0), .DIFF(Sum)) ;Endmodule

CODE 10 library IEEE;use IEEE.Std_Logic_1164.all;use IEEE.Std_Logic_Unsigned.all;entity MUL14×8 isport(A:in std_logic_vector(13 downto 0);B:in std_logic_vector(7 downto 0);Prod:out std_logic_vector (21 downto 0));end MUL14×8;architecture RTL of MUL14×8 issignal sign:std_logic;signal FirstProd:std_logic_vector(21 downto 0);signal Invert:std_logic_vector(7 downto 0);signal InvertProd:std_logic_vector(21 downto 0);beginprocess(A,B,Invert)beginif B(7)='1' thensign<='1';Invert<=not B+"00000001";elsesign<= '0';Invert<=B;end if;end process;FirstProd<= A*Invert;process (FirstProd,InvertProd,sign)beginif sign='1' thenInvertProd<=not FirstProd+ "0000000000000000000001";elseInvertProd<= FirstProd;end if;end process;Prod<=InvertProd;end;

CODE 11
---
—This is the test bench for the 14×8 multiplier.
library IEEE;use IEEE.Std_Logic_1164.all;use IEEE.Std_Logic_Unsigned.all;entity T_MUL14×8 isend T_MUL14×8;architecture TEST of T_MUL14×8 iscomponent MUL14×8port(A:in std_logic_vector(13 downto 0);B:in std_logic_vector(7 downto 0);Prod:out std_logic_vector(21 downto 0));end component;signal A:std_logic_vector (13 downto 0);signal B:std_logic_vector(7 downto 0);signal Prod:std_logic_vector(21 downto 0);begin
---
—Instantiate UUT
---
UUT:MUL14×8 port map (A,B,Prod);
---
—Stimulus:
---
STIMULUS:process
beginA<="00000000000000";B<="00000000";wait for 10 ns;A<="00000000000100";B<="00000010";wait for 10 ns;A<="00000000000100";B<="10000000";wait for 10 ns;A<="01111111111111";B<="10000000";wait for 10 ns;A<="01000000000000";B<="01000000";wait for 10 ns;A<="01111110000000";B<="00000001";wait for 10 ns;A<="01111111111111";B<="11111111";wait; end process STIMULUS;end TEST;
---
Configuration . . .
---
configuration CFG_T_MUL14×8 of T_MUL14×8 is for TEST end for;end CFG_T_MUL14×8;

CODE 12 module MUL14×8_DW01_add_20_0 (A, B, CI, SUM, CO);input [19:0] A;input [19:0] B;output [19:0] SUM-;input CI;output CO; wire n49, n59, n60, n61, n62, n63, n64, n65, n66, n67, n68, n69, n70, n71, n72, n73, n74, n75, n76, n77, n80, n81, n82, n83; and21 U5 (.Y(n49), .A(A[13]), .B(B[13])); buf2 U6 (.Y(SUM[7]), .A(A[7])); buf2 U7 (.Y(SUM[12]), .A(A[12])); buf2 U8 (.Y(SUM[3]), .A(A[3])); buf2 U9 (.Y(SUM[10]), .A(A[10])); buf2 U10 (.Y(SUM[8]), .A(A[8])); buf2 U11 (.Y(SUM[0]), .A(A[0])); buf2 U12 (.Y(SUM[11]), .A(A[11])); buf2 U13 (.Y(SUM[9]), .A(A[9])); buf2 U14 (.Y(SUM[2]), .A(A[2])); inv1 U15 (.Y(SUM[1]), .A(n59)); inv1 U16 (.Y(SUM[5]), .A(n60)); xor21 U17 (.Y(SUM[19]), .A(B[19]), .B(n63)); inv1 U18 (.Y(n76), .A(A[4])); inv1 U19 (.Y(n60), .A(A[5])); inv1 U20 (.Y(n77), .A(A[6])); aoi12 U21 (.Y(n61), .A(B[18]), .B1(A[18]), .B2(n62)); aoi12 U22 (.Y(n63), .A(n61), .B1(n64), .B2(n65)); nor21 U23 (.Y(SUM[13]), .A(n66), .B(n49)); xor31 U24 (.Y(SUM[17]), .A(n67), .B(B[17]), .C(A[17])); xor31 U25 (.Y(SUM[16]), .A(n68), .B(B[16]), .C(n69)); xor31 U26 (.Y(SUM[15]), .A(n70), .B(A[15]), .C(n71)); xor31 U27 (.Y(SUM[14]), .A(n49), .B(A[14]), .C(B[14])); inv1 U28 (.Y(n59), .A(A[1])); inv1 U29 (.Y(n71), .A(B[15])); inv1 U30 (.Y(n72), .A(A[15])); aoi12 U31 (.Y(n68), .A(n73), .B1(B[15]), .B2(A[15])); inv1 U32 (.Y(n69), .A(A[16])); oai12 U33 (.Y(n67), .A(n74), .B1(n68), .B2(n69)); oai12 U34 (.Y(n64), .A(n75), .B1(A[17]), .B2(n67)); inv1 U35 (.Y(n65), .A(A[18])); xor31 U36 (.Y(SUM[18]), .A(n65), .B(B[18]), .C(n64)); inv1 U37 (.Y(SUM[4]), .A(n76)); inv1 U38 (.Y(SUM[6]), .A(n77)); nor21 U39 (.Y(n66), .A(A[13]), .B(B[13])); oai12 U40 (.Y(n80), .A(n49), .B1(B[14]), .B2(A[14])); aoi12 U41 (.Y(n70), .A(n81), .B1(B[14]), .B2(A[14])); aoi12 U42 (.Y(n73), .A(n70), .B1(n71), .B2(n72)); inv1 U43 (.Y(n82), .A(n68)); oai12 U44 (.Y(n74), .A(B[16]), .B1(A[16]), .B2(n82)); aoi12 U45 (.Y(n83), .A(B[17]), .B1(n67), .B2(A[17])); inv1 U46 (.Y(n62), .A(n64)); inv1 U47 (.Y(n81), .A(n80)); inv1 U48 (.Y(n75), .A(n83));endmodule module MUL14×8_DW02_mult_14_80 (A, B, TC, PRODUCT);input [13:0] A;input [7:0] B;output [21:0] PRODUCT;input TC; wire \ab[13][0], \ab[9][1], \ab[3][7], \SUMB [12][1], \CLA_SUM[15], \SUMB[5][2], \CARRYB[6][3], \CARRYB[13][6], \CARRYB[2][1], \ab[7][5], \ab[12][3], \ab[8][2], \SUMB[13][2], \CARRYB[9][4], \ab[6][6], \CARRYB[3][2], \CARRYB[12][5], \ab[2][4], \SUMB[4][1], \CARRYB[7][0], \SUMB[1][4], \CARRYB[13][2], \CARRYB[2][5], \ab[13][4], \ab[9][5], \ab[7][1], \ab[3][3], \SUMB[5][6], \SUMB[12][5], \CLA_SUM[11], \ab[6][2], \ab[2][0], \SUMB[4][5], \CARRYB[8][3], \CARRYB[7][4], \CLA_SUM[18], \CARRYB[12][1], \CARRYB[3][6], \ab[12][7], \ab[8][6], \CARRYB[9][0], \SUMB[13][6], \ab[12][5], \CARRYB[9][2], \ab[8][4], \ab[2][2], \SUMB[13][4], \CARRYB[7][6], \CARRYB[3][4], \ab[13][6], \ab[6][0], \CARRYB[12][3], \CLA_SUM[13], \CLA_SUM[20], \ab[9][7], \CARRYB[8][1], \ab[7][3], \SUMB[1][6], \CARRYB[13][0], \ab[6][4], \ab[3][1], \SUMB[5][4], \CARRYB[6][5], \CARRYB[3][0], \ab[2][6], \SUMB[4][3], \CARRYB[7][2], \ab[12][1],\[8][0], \CARRYB[9][6], \ab[13][2], \ab[7][7], \ab[3][5], \CARRYB[6][1], \SUMB[1][2], \CARRYB[13][4], \CARRYB[2][3], \CARRYB[8][5], \ab[11][4], \ab[9][3], \SUMB[12][3], \CLA_SUM[17], \SUMB[9][2], \CLA_CARRY[15], \ab[5][1], \ab[1][3], \SUMB[10][5], \SUMB[7][6], \SUMB[3][4], \CARRYB[11][2], \ab[10][7], \SUMB[11][6], \ab[4][2], \SUMB[8][1], \CLA_SUM[7], \CARRYB[10][1], \CARRYB[1][6], \SUMB[6][5], \CARRYB[5][4], \ab[11][2], \ab[11][0], \ab[5][5], \ab[1][7], \CARRYB[11][6], \SUMB[10][1], \SUMB[7][2], \CARRYB[4][3], \ab[10][3], \ab[4][6], \[0][4], \SUMB[9][6], \SUMB[6][1], \CARRYB[5][0], \CLA_SUM[3], \SUMB[2][3], \CLA_CARRY[18], \CARRYB[10][5], \CARRYB[1][2], \SUMB[8][5], \ab[10][1], \SUMB[11][2], \ab[4][4], \ab[0][6], \SUMB[6][3], \CARRYB[5][2], \SUMB[10][3], \SUMB[2][1], \CARRYB[1][0], \SUMB[9][4], \CLA_CARRY[20], \ab[5][7], \ab[4][0], \ab[1][5], \SUMB[3][2], \CARRYB[11][4], \CLA_SUM[8], \CARRYB[4][1], \ab[0][2], \SUMB[2][5], \CARRYB[10][3], \CARRYB[1][4], \CARRYB[5][6], \SUMB[11][4], \ab[10][5], \ab[5][3], \ab[1][1], \SUMB[8][3], \CLA_SUM[5], \SUMB[7][4], \CARRYB[4][5], \SUMB[3][6], \CARRYB[11][0], \ab[11][6], \CLA_CARRY[17], \ab[10][4], \ab[4][1], \ab[0][3], \SUMB[2][4], \CARRYB[10][2], \CARRYB[1][5], \SUMB[6][6], \SUMB[11][5], \SUMB[8][2][2], \CLA_SUM[4], \ab[1][0], \SUMB[7][5], \CARRYB[4][4], \ab[11][7], \ab[5][2], \CLA_CARRY[16], \SUMB[9][1], \CARRYB[11][1], \SUMB[10][6], \ab[11][3], \ab[10][0], \SUMB[11][1], \SUMB[8][6], \ab[4][5], \ab[0][7], \CARRYB[5][3], \SUMB[6][2], \CARRYB[10][6], \CARRYB[1][1], \ab[5][6], \SUMB[10][2], \SUMB[9][5], \SUMB[3][3], \CARRYB[11][5], \CLA_SUM[9], \ab[5][4], \ab[1][4], \SUMB[7][1], \CARRYB[4][0], \SUMB[3][1], \ab[11][5], \ab[11][1], \ab[1][6], \SUMB[7][3], \CARRYB[4][2], \ab[10][2], \ab[4][7], \ab[0][5], \CARRYB[5][1], \CLA_CARRY[19], \SUMB[2][2], \CARRYB[10][4], \CARRYB[1][3], \SUMB[8][4], \SUMB[11][3], \CLA_SUM[2], \SUMB[10][4], \SUMB[9][3], \CLA_CARRY[14], \ab[1][2], \CARRYB[4][6], \ab[10][6], \ab[5][0], \SUMB[3][5], \CARRYB[11][3], \ab[12][0], \ab[6][5], \ab[4][3], \CLA_SUM[6], \ab[0][1], \SUMB[2][6], \CARRYB[10][0], \CARRYB[5][5], \SUMB[6][4], \CARRYB[12][6], \CARRYB[3][1], \ab[2][7], \SUMB[4][2], \CARRYB[7][3], \ab[8][1], \SUMB[13][1], \ab[13][3], \ab[7][6], \[3][4], \SUMB[5][1], \CARRYB[6][0], \SUMB[1][3], \CARRYB[13][5], \CARRYB[2][2], \SUMB[12][2], \CARRYB[8][4], \CLA_SUM[16], \ab[9][2], \CARRYB[9][3], \ab[12][4], \SUMB[13][5], \ab[8][5], \ab[6][1], \ab[2][3], \SUMB[4][6], \CARRYB[12][2], \CARRYB[3][5], \ab[9][6], \SUMB[12][6], \CLA_SUM[12], \CARRYB[8][0], \CARRYB[13][1], \ab[7][2], \CARRYB[2][6], \ab[3][0], \SUMB[5][5], \CARRYB[6][4], \CARRYB[2][4], \ab[13][5], \ab[9][4], \ab[7][0], \SUMB[1][5], \CARRYB[13][3], \[3][2], \CARRYB[6][6], \ab[6][3], \ab[2][1], \SUMB[12][4], \CLA_SUM[10], \SUMB[4][4], \CARRYB[8][2], \CARRYB[7][5], \CLA_SUM[19], \CARRYB[12][0], \CARRYB[9][1], \ab[13][1], \AB[12][6], \ab[8][7], \SUMB[13][7], \ab[9][0], \CARRYB[8][6], \CLA_SUM[14], \ab[7][4], \ab[3][6], \SUMB[5][3], \CARRYB[6][2], \SUMB[1][1], \CARRYB[2][0], \ab[12][2], \ab[8][3], \SUMB[13][3], \ab[6][7], \CARRYB[9][5], \CARRYB[3][3], \CARRYB[12][4], \ab[2][5], \CARRYB[7][1], n10, n11, n12, n13, n14, n15, n16, n17, n31, n32, n33, n34, n35, n36, n37, n38, n39, n40, n41, n42, n43, n44, n45, n46, n47, n48, n50, n51, n52, n53; inv3 U5 (.Y(n10), .A(B[1])); inv3 U6 (.Y(n11), .A(B[4])); inv3 U7 (.Y(n12), .A(B[7])); inv3 U8 (.Y(n13), .A(B[6])); inv3 U9 (.Y(n14), .A(B[0])); inv3 U10 (.Y(n15), .A(B[5])); inv3 U11 (.Y(n16), .A(B[2])); inv3 U12 (.Y(n17), .A(B[3])); and21 U13 (.Y(\CLA_CARRY[18]), .A(\CARRYB[13][4]), .B(\SUMB[13][5])); xor21 U14 (.Y(\CLA_SUM[18]), .A(\CARRYB[13][4]), .B(\SUMB[13][5])); and21 U27 (.Y(\CLA_CARRY[14]), .A(\CARRYB[13][0]), .B(\SUMB[13][1])); xor21 U28 (.Y(\CLA_SUM[14]), .A(\CARRYB[13][0]), .B(\SUMB[13][1])); and21 U29 (.Y(\CARRYB[1][0]), .A(\ab[1][0]), .B(\ab[0][1])); xor21 U30 (.Y(PRODUCT[1]), .A(\ab[1][0]), .B(\ab[0][1])); and21 U31 (.Y(\CLA_CARRY[15]), .A(\CARRYB[13][1]), .B(\SUMB[13][2])); xor21 U32 (.Y(\CLA_SUM[15]), .A(\CARRYB[13][1]), .B(\SUMB[13][2])); and21 U33 (.Y(\CARRYB[1][1]), .A(\ab[1][1]), .A(\ab[1][1]), .B(\ab[0][2])); xor21 U34 (.Y(\SUMB[1][1]), .A(\ab[1][1]), .B(\ab[0][2])); and21 U35 (.Y(\CLA_CARRY[17]), .A(\CARRYB[13][3]), .B(\SUMB[13][4])); xor21 U36 (.Y(\CLA_SUM[17]), .A(\CARRYB[13][3]), .B(\SUMB[13][4])); and21 U37 (.Y(\CLA_CARRY[16]), .A(\CARRYB[13][2]), .B(\SUMB[13][3])); xor21 U38 (.Y(\CLA_SUM[16]), .A(\CARRYB[13][2]), .B(\SUMB[13][3])); and21 U39 (.Y(\CARRYB[1][4]), .A(\ab[1][4]), .B(\ab[0][5])); xor21 U40 (.Y(\SUMB[1][4]), .A(\ab[1][4]), .B(\ab[0][5])); and21 U41 (.Y(\CARRYB[1][3]), .A(\ab[1][3]), .B(\ab[0][4])); xor21 U42 (.Y(\SUMB[1][3]), .A(\ab[1][3]), .B(\ab[0][4])); and21 U43 (.Y(\CARRYB[1][2]), .A(\ab[1][2]), .B(\ab[0][3])); xor21 U44 (.Y(\SUMB[1][2]), .A(\ab[1][2]), .B(\ab[0][3])); and21 U45 (.Y(\CLA_CARRY[19]), .A(\CARRYB[13][5]), .B(\SUMB[13][6])); xor21 U46 (.Y(\CLA_SUM[19]), .A(\CARRYB[13][5]), .B(\SUMB[13][6])); and21 U47 (.Y(\CARRYB[1][5]), .A(\ab[1][5]), .B(\ab[0][6])); xor21 U48 (.Y(\SUMB[1][5]), .A(\ab[1][5]), .B(\ab[0][6])); and21 U50 (.Y(\CLA_CARRY[20]), .A(\CARRYB[13][6]), .B(\SUMB[13][7])); xor21 U51 (.Y(\CLA_SUM[20]), .A(\CARRYB[13][6]), .B(\SUMB[13][7])); and21 U52 (.Y(\CARRYB[1][6]), .A(\ab[1][6]), .B(\ab[0][7])); xor21 U53 (.Y(\[1][6]), .A(\ab[1][6]), .B(\ab[0][7])); nor21 U54 (.Y(\ab[12][2]), .A(n31), .B(n32)); nor21 U55 (.Y(\ab[8][0]), .A(n33), .B(n34)); nor21 U56 (.Y(\ab[2][7]), .A(n35), .B(n36)); nor21 U57 (.Y(\ab[0][1]), .A(n37), .B(n38)); nor21 U58 (.Y(\ab[9][0]), .A(n39), .B(n14)); nor21 U59 (.Y(\ab[3][7]), .A(n35), .B(n40)); nor21 U60 (.Y(\ab[1][]), .A(n37), .B(n41)); nor21 U61 (.Y(\ab[7][2]), .A(n31), .B(n42)); nor21 U62 (.Y(\ab[2][4]), .A(n43), .B(n36)); nor21 U63 (.Y(\ab[13][6]), .A(n44), .B(n45)); nor21 U64 (.Y(\ab[3][4]), .A(n43), .B(n40)); nor21 U65 (.Y(\ab[13][1]), .A(n37), .B(n45)); nor21 U66 (.Y(\ab[12][5]), .A(n46), .B(n32)); nor21 U67 (.Y(\ab[1][0]), .A(n33), .B(n47)); nor21 U68 (.Y(\ab[10][0]), .A(n33), .B(n48)); nor21 U69 (.Y(\ab[6][5]), .A(n46), .B(n50));m nor21 U70 (.Y(\ab[3][3]), .A(n51), .B(n40)); nor21 U71 (.Y(\ab[7][5]), .A(n46), .B(n42)); nor21 U72 (.Y(\ab[5][0]), .A(n33), .B(n52)); nor21 U73 (.Y(\ab[4][0]), .A(n33), .B(n53)); nor21 U74 (.Y(\ab[3][2]), .A(n31), .B(n40)); nor21 U75 (.Y(\ab[2][3]), .A(n51), .B(n36)); nor21 U76 (.Y(\ab[1][6]), .A(n44), .B(n41)); nor21 U77 (.Y(\ab[0][6]), .A(n44), .B(n38)); nor21 U78 (.Y(\ab[11][1]), .A(n37), .B(n48)); nor21 U79 (.Y(\ab[7][4]), .A(n43), .B(n42)); nor21 U80 (.Y(\ab[5][2]), .A(n31), .B(n52)); nor21 U81 (.Y(\ab[13][0]), .A(n33), .B(n45)); nor21 U82 (.Y(\ab[11][1]), .A(n37), .B(n47)); nor21 U83 (.Y(\ab[6][4]), .A(n43), .B(n50)); nor21 U84 (.Y(\ab[12][7]), .A(n35), .B(n32)); nor21 U85 (.Y(\ab[12][4]), .A(n43), .B(n32)); nor21 U86 (.Y(\ab[8][6]), .A(n44), .B(n34)); nor21 U87 (.Y(\ab[7][7]), .A(n35), .B(n42)); nor21 U88 (.Y(\ab[5][1]), .A(n37), .B(n52)); nor21 U89 (.Y(\ab[6][7]), .A(n35), .B(n50)); nor21 U90 (.Y(\ab[4][1]), .A(n37), .B(n53)); nor21 U91 (.Y(\ab[9][6]), .A(n39), .B(n13)); nor21 U92 (.Y(\ab[9][1]), .A(n39), .B(n10)); nor21 U93 (.Y(\ab[12][3]), .A(n51), .B(n32)); nor21 U94 (.Y(\ab[4][6]), .A(n44), .B(n53)); nor21 U95 (.Y(\ab[1][0]), .A(n33), .B(n41)); nor21 U96 (.Y(\ab[5][6]), .A(n44), .B(n52)); nor21 U97 (.Y(PRODUCT[0]), .A(n33), .B(n38)); nor21 U98 (.Y(\ab[8][1]), .A(n37), .B(n34)); nor21 U99 (.Y(\ab[11][6]), .A(n44), .B(n47)); nor21 U100 (.Y(\ab[6][3]), .A(n51), .B(n50)); nor21 U101 (.Y(\ab[3][5]), .A(n46), .B(n40)); nor21 U102 (.Y(\ab[12][1]), .A(n37), .B(n32)); nor21 U103 (.Y(\ab[10][6]), .A(n44), .B(n48)); nor21 U104 (.Y(\ab[1][2]), .A(n31), .B(n41)); nor21 U105 (.Y(\ab[8][3]), .A(n51), .B(n34)); nor21 U106 (.Y(\ab[7][3]), .A(n51), .B(n42)); nor21 U107 (.Y(\ab[2][5]), .A(n46), .B(n36)); nor21 U108 (.Y(\ab[4][2]), .A(n31), .B(n53)); nor21 U109 (.Y(\ab[5][4]), .A(n43), .B(n52)); nor21 U110 (.Y(\ab[4][4]), .A(n43), .B(n53)); nor21 U111 (.Y(\ab[13][5]), .A(n46), .B(n45)); nor21 U112 (.Y(\ab[11][7]), .A(n35), .B(n47)); nor21 U113 (.Y(\ab[10][4]), .A(n43), .B(n48)); nor21 U114 (.Y(\ab[9][3]), .A(n39), .B(n17)); nor21 U115 (.Y(\ab[7][1]), .A(n37), .B(n42)); nor21 U116 (.Y(\ab[5][7]), .A(n35), .B(n52)); nor21 U117 (.Y(\ab[6][1]), .A(n37), .B(n50)); nor21 U118 (.Y(\ab[4][7]), .A(n35), .B(n53)); nor21 U119 (.Y(\ab[11][4]), .A(n43), .B(n47)); nor21 U120 (.Y(\ab[10][7]), .A(n35), .B(n48)); nor21 U121 (.Y(\ab[9][7]), .A(n39), .B(n12)); nor21 U122 (.Y(\ab[13][2]), .A(n31), .B(n45)); nor21 U123 (.Y(\ab[11][3]), .A(n51), .B(n47)); nor21 U124 (.Y(\ab[6][6]), .A(n44), .B(n50)); nor21 U125 (.Y(\ab[3][0]), .A(n33), .B(n40)); nor21 U126 (.Y(\ab[12][6]), .A(n44), .B(n32)); nor21 U127 (.Y(\ab[10][3]), .A(n51), .B(n48)); nor21 U128 (.Y(\ab[7][6]), .A(n44), .B(n42)); nor21 U129 (.Y(\ab[2][0]), .A(n33), .B(n36)); nor21 U130 (.Y(\ab[9][4]), .A(n39), .B(n11)); nor21 U131 (.Y(\ab[8][7]), .A(n35), .B(34)); nor21 U132 (.Y(\ab[4][3]), .A(n51), .B(n53)); nor21 U133 (.Y(\ab[1][5]), .A(n46), .B(n41)); nor21 U134 (.Y(\ab[13][3]), .A(n51), .B(n45)); nor21 U135 (.Y(\ab[11][2]), .A(n31), .B(n47)); nor21 U136 (.Y(\ab[10][2]), .A(n16), .B(n48)); nor21 U137 (.Y(\ab[8][4]), .A(n43), .B(n34)); nor21 U138 (.Y(\ab[5][3]), .A(n17), .B(n52)); nor21 U139 (.Y(\ab[0][5]), .A(n46), .B(n38)); nor21 U140 (.Y(\ab[0][2]), .A(n31), .B(n38)); nor21 U141 (.Y(\ab[2][1]), .A(n10), .B(n36)); nor21 U142 (.Y(\ab[0][7]), .A(n35), .B(n38)); nor21 U143 (.Y(\ab[3][1]), .A(n37), .B(n40)); nor21 U144 (.Y(\ab[1][7]), .A(n12), .B(n41)); nor21 U145 (.Y(\ab[8][5]), .A(n46), .B(n34)); nor21 U146 (.Y(\ab[0][4]), .A(n43), .B(n38)); nor21 U147 (.Y(\SUMB[13][7]), .A(n35), .B(n45)); nor21 U148 (.Y(\ab[6][2]), .A(n31), .B(n50)); nor21 U149 (.Y(\ab[9][5]), .A(n39), .B(n15)); nor21 U150 (.Y(\ab[1][4]), .A(n11), .B(n41)); nor21 U151 (.Y(\ab[12][0]), .A(n14), .B(n32)); nor21 U152 (.Y(\ab[9][2]), .A(n39), .B(n16)); nor21 U153 (.Y(\ab[4][5]), .A(n46), .B(n53)); nor21 U154 (.Y(\ab[1][3]), .A(n51), .B(n41)); nor21 U155 (.Y(\ab[8][2]), .A(n31), .B(n34)); nor21 U156 (.Y(\ab[5][5]), .A(n46), .B(n52)); nor21 U157 (.Y(\ab[2][2]), .A(n31), .B(n36)); nor21 U158 (.Y(\ab[0][3]), .A(n51), .B(n38)); nor21 U159 (.Y(\ab[13][4]), .A(n43), .B(n45)); nor21 U160 (.Y(\ab[6][0]), .A(n33), .B(n50)); nor21 U161 (.Y(\ab[3][6]), .A(n13), .B(n40)); nor21 U162 (.Y(\ab[11][5]), .A(n15), .B(n47)); nor21 U163 (.Y(\ab[10][5]), .A(n46), .B(n48)); nor21 U164 (.Y(\ab[7][0]), .A(n33), .B(42)); nor21 U165 (.Y(\ab[2][6]), .A(n44), .B(n36)); inv1 U166 (.Y(n39), .A(A[9])); inv1 U167 (.Y(n35), .A(B[7])); inv1 U168 (.Y(n44), .A(B[6])); inv1 U169 (.Y(n46), .A(B[5])); inv1 U170 (.Y(n43), .A(B[4])); inv1 U171 (.Y(n51), .A(B[3])); inv1 U172 (.Y(n31), .A(B[2])); inv1 U173 (.Y(n37), .A(B[1])); inv1 U174 (.Y(n33), .A(B[0])); inv1 U175 (.Y(n34), .A(A[8])); inv1 U176 (.Y(n42), .A(A[7])); inv1 U177 (.Y(n50), .A(A[6])); inv1 U178 (.Y(n52), .A(A[5])); inv1 U179 (.Y(n53), .A(A[4])); inv1 U180 (.Y(n40), .A(A[3])); inv1 U181 (.Y(n36), .A(A[2])); inv1 U182 (.Y(n41), .A(A[1])); inv1 U183 (.Y(n45), .A(A[13])); inv1 U184 (.Y(n32), .A(A[12])); inv1 U185 (.Y(n47), .A(A[11])); inv1 U186 (.Y(n48), .A(A[10])); inv1 U187 (.Y(n38), .A(A[0])); MUL14×8_DW01_add_20_0 FS (.A ({1'b0, \CLA_SUM[20], \CLA_SUM[19], \CLA_SUM[18], \CLA_SUM[17], \CLA_SUM[16], \CLA_SUM[15], \CLA_SUM[14], \CLA_SUM[13], \CLA_SUM[12], \CLA_SUM[11], \CLA_SUM[10], \CLA_SUM[9], \CLA_SUM[8], \CLA_SUM[7], \CLA_SUM[6], \CLA_SUM[5], \CLA_SUM[4], \CLA_SUM[3], \CLA_SUM[2]}), .B({\CLA_CARRY[20], \CLA_CARRY[19], \CLA_CARRY[18], \CLA_CARRY[17], \CLA_CARRY[16], \CLA_CARRY[15], \CLA_CARRY[14], 1'b0, 1'b0, 1'b0, 1'b0, 1'b0, 1'b0, 1'b0, 1'b0, 1'b0, 1'b0, 1'b0, 1'b0, 1'b0, 1'b0}), .CI(1'b0), .SUM(PRODUCT[21:2])); fadd S2_7_4 (.S(\SUMB[7][4]), .CO(\CARRYB[7][4]), .CI(\SUMB[6][5]), .B(\CARRYB[6][4]), .A(\ab[7][4])); fadd S2_2_2 (.S(\SUMB[2][2]), .CO(\CARRYB[2][2]), .CI(\SUMB[1][3]), .B(\CARRYB[1][2]), .A(\ab[2][2])); fadd S2_12_1 (.S(\SUMB[12][1]), .CO(\CARRYB[12][1]), .CI(\SUMB[11][2]), .B(\CARRYB[11][1]), .A(\ab[12][1])); fadd S2_3_2 (.S(\SUMB[3][2]), .CO(\CARRYB[3][2]), .CI(\SUMB[2][3]), .B(\CARRYB[2][2]), .A(\ab[3][2])); fadd S4_2 (.S(\SUMB[13][2]), .CO(\CARRYB[13][2]), .CI(\SUMB[12][3]), .B(\CARRYB[12][2]), .A(\ab[13][2])); fadd S2_6_4 (.S(\SUMB[6][4]), .CO(\CARRYB[6][4]), .CI(\SUMB[5][5]), .B(\CARRYB[5][4]), .a(\ab[6][4])); fadd S2_5_1 (.S(\SUMB[5][1]), .CO(\CARRYB[5][1]), .CI(\SUMB[4][2]), .B(\CARRYB[4][1]), .A(\ab[5][1])); fadd S2_10_4 (.S(\SUMB[10][4]), .CO(\CARRYB[10][4]), .CI(\SUMB[9][5]), .B(\CARRYB[9][4]), .A(\ab[10][4])); fadd S3_12_6 (.S(\SUMB[12][6]), .CO(\CARRYB[12][6]), .CI(\ab[11][7]), .B(\CARRYB[11][6]), .A(\ab[12][6]); fadd S2_11_4 (.S(\SUMB[11][4]), .CO(\CARRYB[11][4]), .CI(\SUMB[10][5]), .B(\CARRYB[10][4]), .A(\ab[11][4])); fadd S2_4_1 (.S(\SUMB[4][1]), .CO(\CARRYB[4][1]), .CI(\SUMB[3][2]), .B(\CARRYB[3][1]), .A(\ab[4][1])); fadd S1_6_0 (.S(\CLA_SUM[6]), .CO(\CARRYB[6][0]), .CI(\SUMB[5][1]), .B(\CARRYB[5][0]), .A(\ab[6][0])); fadd S1_10_0 (.S(\CLA_SUM[10]), .CO(\CARRYB[10][0]), .CI(\SUMB[9][1]), .B(\CARRYB[9][0]), .A(\ab[10][0])); fadd S2_11_3 (.S(\SUMB[11][3]), .CO(\CARRYB[11][3]), .CI(\SUMB[10][4]), .B(\CARRYB[10][3]), .A(\ab[11][3])); fadd S3_6_6 (.S(\SUMB[6][6]), .CO(\CARRYB[6][6]), .CI(\ab[6][7]), .B(\CARRYB[5][6]), .A(\ab[6][6])); fadd S2_9_1 (.S(\SUMB[9][1]), .CO(\CARRYB[9][1]), .CI(\SUMB[8][2]), .B(\CARRYB[8][2]), .A(\ab[9][1])); fadd S3_7_6 (.S(\SUMB[7][6]), .CO(\CARRYB[7][6]), .CI(\ab[6][7]), .B(\CARRYB[6][6]), .A(\ab[7][6])); fadd S2_8_1 (.S(\SUMB[8][1]), .CO(\CARRYB[8][1]), .CI(\SUMB[7][2]), .B(\CARRYB[7][1]), .A(\ab[8][1])); fadd S2_10_3 (.S(\SUMB[10][3]), .CO(\CARRYB[10][3]), .C(\SUMB[9][4]), .B(\CARRYB[9][3]), .A(\ab[10][3])); fadd S1_11_0 (.S(\CLA_SUM[11]), .CO(\CARRYB[11][10]), .CI(\SUMB[10][1]), .B(\CARRYB[10][0]), .A(\ab[11][0])); fadd S2_3_5 (.S(\SUMB[3][5]), .CO(\CARRYB[3][5]), .CI(\SUMB[2][6]), .B(\CARRYB[2][5]), .A(\ab[3][5])); fadd S2_6_3 (.S(\SUMB[6][3]), .CO(\CARRYB[6][3]), .CI(\SUMB[5][4]), .B(\CARRYB[5][3]), .A(\ab[6][3])); fadd S1_7_0 (.S(\CLA_SUM[7]), .CO(\CARRYB[7][0]), .CI(\SUMB[6][1]), .B(\CARRYB[6][0]), .A(\ab[7][0])); fadd S4_5 (.S(\SUMB[13][5]), .CO(\CARRYB[13][5]), .CI(\SUMB[12][6]), .B(\CARRYB[12][6]), .B(\CARRYB[12][5]), .A(\ab[13][5])); fadd S2_2_5 (.S(\SUMB[2][5]), CO(\CARRYB[2][5]), .CI(\SUMB[1][6]), .B(\CARRYB[1][5]), .A(\ab[2][5])); fadd S2_7_3 (.S(\SUMB[7][3]), .CO(\CARRYB[7][3]), .CI(\SUMB[6][4]), .B(\CARRYB[6][3]), .A(\ab[7][3])); fadd S2_10_2 (.S(\SUMB[10][2]), .CO(\CARRYB[10][2]), .CI(\SUMB[9][3]), .B(\CARRYB[9][2]), .A(\ab[10][2])); fadd S2_11_2 (.S(\SUMB[11][2]), .CO(\CARRYB[11][2]), .CI(\SUMB[10][3]), .B(\CARRYB[10][2]), .A(\ab[11][2])); fadd S2_2_4 (.S(\SUMB[2][4]), .CO(\CARRYB[2][2]), .CI(\SUMB[1][5]), .B(\CARRYB[1][4]), .A(\ab[2][4])); fadd S2_7_2 (.S(\SUMB[7][2]), .CO(\CARRYB[7][2]), .CI(\SUMB[6][3]), .B(\CARRYB[6][2]), .A(\ab[7][2])); fadd S4_4 (.S(\SUMB[13][4]), .CO(\CARRYB[13][4]), .CI(\SUMB[12][5]), .B(\CARRYB[12][4]), .A(\ab[13][4])); fadd S2_6_2 (.S(\SUMB[6][2]), .CO(\CARRYB[6][2]), .CI(\SUMB[5][3]), .B(\CARRYB[5][2]), .A(\ab[6][2])); fadd S2_3_4 (.S(\SUMB[3][4]), .CO(\CARRYB[3][4]), .CI(\SUMB[2][5]), .B(\CARRYB[2][4]), .A(\ab[3][4])); fadd S2_3_3 (.S(\SUMB[3][3]), .CO(\CARRYB[3][3]), .CI(\SUMB[2][4]), .B(\CARRYB[2][3]), .A(\ab[3][3])); fadd S2_6_5 (.S(\SUMB[6][5]), .CO(\CARRYB[6][5]), .CI(\SUMB[5][6]), .B(\CARRYB[5][5]), .A(\ab[6][5])); fadd S4_3 (.S(\SUMB[131[3]), .CO(\CARRYB[13][3]), .CI(\SUMB[12][4]), .B(\CARRYB[12][3]), .A(\ab[13][3])); fadd S2_7_5 (.S(\SUMB[7][5]), .CO(\CARRYB[7][5]), .CI(\SUMB[6][6]), .B(\CARRYB[6][5]), .A(\ab[7][5])); fadd S2_2_3 (.S(\SUMB[2][3]), .CO(\CARRYB[2][3]), .CI(\SUMB[1][4]), .B(\CARRYB[1][3]), .A(\ab[2][3])); fadd S3_3_6 (.S(\SUMB[3][6]), .CO(\CARRYB[3][6]), .CI(\ab[2][7]), .B(\CARRYB[2][6]), .A(\ab[3][6])); fadd S1_3_0 (.S(\CLA_SUM[3]), .CO(\CARRYB[3][0]), .CI(\SUMB[2][1]), .B(\CARRYB[2][0]), .A(\ab[3][0])); fadd S2_11_5 (.S(\SUMB[11][5]), .CO(\CARRYB[11][5]), .CI(\SUMB[10][6]), .B(\CARRYB[10][5]), .A(\ab[11] (5])); fadd S2_10_5 (.S(\SUMB[10][5]), .CO(\CARRYB[10][5]), .CI(\SUMB[9][6]), .B(\CARRYB[9][5]), .A(\ab[10][5])); fadd S3_2_6 (.S(\SUMB[2][6]), .CO(\CARRYB[2][6]), .CI(\ab[1][7]), .B(\CARRYB[1][6]), .A(\ab[2][6])); fadd S1_2_0 (.S(\CLA_SUM[2]), .CO(\CARRYB[2][0]), .CI(\SUMB[1][1]), .B(\CARRYB[1][0]), .A(\ab[2][0])); fadd S2_2_1 (.S(\SUMB[2][1]), .CO(\CARRYB[2][1]), .CI(\SUMB[1][2]), .B(\CARRYB[1][1]), .A(\ab[2][1])); fadd S2_12_ (.S(\SUMB[12][2]), .CO(\CARRYB[12][2]), .CI(\SUMB[11][3]), .B(\CARRYB[11][2]), .A(\ab[12][2])); fadd S4_1 (.S(\SUMB[13][1]), .CO(\CARRYB[13][1]), .CI(\SUMB[12][2]), .B(\CARRYB[12][1]), .A(\ab[13][1])); fadd S2_3_1 (.S(\SUMB[3][1]), .CO(\CARRYB[3][1]), .CI(\SUMB[2][2]), .B(\CARRYB[2][1]), .A(\ab[3][1])); fadd S2_5_2 (.S(\SUMB[5][2]), .CO(\CARRYB[5][2]), .CI(\SUMB[4][3]), .B(\CARRYB[4][2]), .A(\ab[5][2])); fadd S2_8_5 (.S(\SUMB[8][5]), .CO(\CARRYB[8][5]), .CI(\SUMB[7][6]), .B(\CARRYB[7][5]), .A(\ab[8][5])); fadd S2_9_5 (.S(\SUMB[9][5]), .CO(\CARRYB[9][5]), .CI(\SUMB[8][6]), .B(\CARRYB[8][5]), .A(\ab[9][5])); fadd S2_4_2 (.S(\SUMB[4][2]), .CO(\CARRYB[4][2]), .CI(\SUMB[3][3]), .B(\CARRYB[3][2]), .A(\ab[4][2])); fadd S2_45 (.S(\SUMB[4][5]), .CO(\CARRYB[4][5]), .CI(\SUMB[3][6]), .B(\CARRYB[3][5]), .A(\ab[4][5])); fadd S2_9_2 (.S(\SUMB[9][2]), .CO(\CARRYB[9][2]), .CI(\SUMB[8][3]), .B(\CARRYB[8][2]), .A(\ab[9][2])); fadd S2_8_2 (.S(\SUMB[8][2]), .CO(\CARRYB[8][2]), .CI(\SUMB[7][3]), .B(\CARRYB[7][2]), .A(\ab[8][2])); fadd S2_5_5 (.S(\SUMB[5][5]), .CO(\CARRYB[5][5]), .CI(\SUMB[4][6]), . (\CARRYB[4][5]), .A(\ab[5][5])); fadd S2_12_5 (.S(\SUMB[12][5]), .CO(\CARRYB[12][5]), .CI(\SUMB[11][6]), .B(\CARRYB[11][5]), .A(\ab[12][5])); fadd S5_6 (.S(\SUMB[13][6]), .CO(\CARRYB[13][6]), .CI(\ab[12][7]), .B(\CARRYB[12][6]), .A(\ab[13][6])); fadd S2_5_4 (.S(\SUMB[5][4]), .CO(\CARRYB[5][4]), .CI(\SUMB[4][5]), .B(\CARRYB[4][4]), .A(\ab[5][4])); fadd S2_8_3 (.S(\SUMB[8][3]), .CO(\CARRYB[8][3]), .CI(\SUMB[7][4]), .B(\CARRYB[7][3]), .A(\ab[8][3])); fadd S2_10_1 (.S(\SUMB[10][1]), .CO(\CARRYB[10][1]), .CI(\SUMB[9][2]), .B(\CARRYB[9][1]), .A(\ab[10][1])); fadd S2_9_3 (.S(\SUMB[9][3]), .CO(\CARRYB[9][3]), .CI(\SUMB[8][4]), .B(\CARRYB[8][3]), .A(\ab[9][3])); fadd S2_11_1 (.S(\SUMB[11][1]), .CO(\CARRYB[11][1]), .CI(\SUMB[10][2]), .B(\CARRYB[10][1]), .A(\ab[11][1])); fadd S2_4_4 (.S(\SUMB[4][4]), .CO(\CARRYB[4][4]), .CI(\SUMB[3][5]), .B(\CARRYB[3][4]), .A(\ab[4][4])); fadd S3_8_6 (.S(\SUMB[8][6]), .CO(\CARRYB[8][6]), .CI(\ab[7][7]), .B(\CARRYB[7][6]), .A(\ab[8][6])); fadd S2_7_1 (.S(\SUMB[7][1]), .CO(\CARRYB[7][1]), .CI(\SUMB[6][2]), .B(\CARRYB[6][1]), .A(\ab[7][1])); fadd S3_11_6 (.S(\SUMB[11][6]), .CO(\CARRYB[11][6]), .CI(\ab[10][7]), .B(\CARRYB[10][6]), .A(\ab[11][6])); fadd S2_12_4 (.S(\SUMB[12][4]), .CO(\CARRYB[12][4]), .CI(\SUMB[11][5]), .B(\CARRYB[11][4]), .A(\ab[12][4])); fadd S1_8_0 (.S(\CLA_SUM[8]), .CO(\CARRYB[8][0]), .CI(\SUMB[7][1]), .B(\CARRYB[7][0]), .A(\ab[8][0])); fadd S1_9_0 (.S(\CLA_SUM[9]), .CO(\CARRYB[9][0]), .CI(\SUMB[8][1]), .B(\CARRYB[8][0]), .A(\ab[9][0])); fadd S3_10_6 (.S(\SUMB[10][6]), .CO(\CARRYB[10][6]), .CI(\ab[9][7]), .B(\CARRYB[9][6]), .A(\ab[10][6])); fadd S2_6_1 (.S(\SUMB[6][1]), .CO(\CARRYB[6][1]), .CI(\SUMB[5][2]), .B(\CARRYB[5][1]), .A(\ab[6][1])); fadd S3_9_6 (.S(\SUMB[9][6]), .CO(\CARRYB[9][6]), .CI(\ab[8][7]), .B(\CARRYB[8][6]), .A(\ab[9][6])); fadd S3_4_6 (.S(\SUMB[4][6]), .CO(\CARRYB[4][6]), .CI(\ab[3][7]), .B(\CARRYB[3][6]), .A(\ab[4][6])); fadd S1_4_0 (.S(\CLA_SUM[4]), .CO(\CARRYB[4][0]), .CI(\SUMB[3][1]), .B(\CARRYB[3][0]), .A(\ab[4][0])); fadd S1_12_0 (.S(\CLA_SUM[12]), .CO(\CARRYB[12][0]), .CI(\SUMB[11][1]), .B(\CARRYB[11][0]), .A(\ab[12][0])); fadd S4_0 (.S(\CLA_SUM[13]), .CO(\CARRYB[13][0]), .CI(\SUMB[12][1]), .B(\CARRYB[12][0]), .A(\ab[13][0])); fadd S3_5_6 (.S(\SUMB[5][6]), .CO(\CARRYB[5][6]), .CI(\ab[4][7]), .B(\CARRYB[4][6]), .A(\ab[5][6])); fadd S2_12_3 (.S(\SUMB[12][3]), .CO(\CARRYB[12][3]), .CI(\SUMB[11][4]), .B(\CARRYB[11][3]), .A(\ab[12][3])); fadd S1_5_0 (.S(\CLA_SUM[5]), .CO(\CARRYB[5][0]), .CI(\SUMB[4][1]), .B(\CARRYB[4][0]), .A(\ab[5][0])); fadd S2_4_3 (.S(\SUMB[4][3]), .CO(\CARRYB[4][3]), .CI(\SUMB[3][4]), .B(\CARRYB[3][3]), .A(\ab[4][3])); fadd S2_9_4 (.S(\SUMB[9][4]), .CO(\CARRYB[9][4]), .CI(\SUMB[8][5]), .B(\CARRYB[8][4]), .A(\ab[9][4])); fadd S2_8_4 (.S(\SUMB[8][4]), .CO(\CARRYB[8][4]), .CI(\SUMB[7][5]), .B(\CARRYB[7][4]), .A(\ab[8][4])); fadd S2_5_3 (.S(\SUMB[5][3]), .CO(\CARRYB[5][3]), .CI(\SUMB[4][4]), .B(\CARRYB[4][3]), .A(\ab[5][3]));endmodule
module MUL14×8_DW01_inc_22_0 (A, SUM);input [21:0] A;output [21:0] SUM; wire n1, n2, n3, n4, n5, n6, n7, n8, n9, n54, n55, n56, n57, n58, n78, n79, n84, n85, n86, n87, n88, n89, n90, n91, n92, n93, n94, n95, n96, n97; inv1 U5 (.Y(SUM[0]), .A(A[0])); nor21 U6 (.Y(n1), .A(n2), .B(n3)); nor21 U7 (.Y(n4), .A(n5), .B(n6)); nor21 U8 (.Y(n7), .A(n8), .B(n9)); nand21 U9 (.Y(n54), .A(A[1]), .B(A[0])); inv1 U10 (.Y(n55), .A(A[2])); nor21 U11 (.Y(n56), .A(n55), .B(n54)); inv1 U12 (.Y(n57), .A(A[5])); nand31 U13 (.Y(n58), .A(A[3]), .B(n56), .C(A[4])); nor21 U14 (.Y(n78), .A(n58), .B(n57)); nand21 U15 (.Y(n2), .A(A[6]), .B(n78)); inv1 U16 (.Y(n3), .A(A[7])); nor31 U17 (.Y(n79), .A(n3), .B(n2), .C(n84)); nand21 U18 (.Y(n85), .A(n79), .B(A[9])); inv1 U19 (.Y(n86), .A(A[10])); nor21 U20 (.Y(n87), .A(n86), .B(n85)); inv1 U21 (.Y(n88), .A(A[13])); nand31 U22 (.Y(n89), .A(A[11]), .B(n87), .C(A[12])); nor21 U23 (.Y(n90), .A(n89), .B(n88)); nand21 U24 (.Y(n8), .A(A[14]), .B(n90)); inv1 U25 (.Y(n9), .A(A[15])); nor31 U26 (.Y(n91), .A(n9), .B(n8), .C(n92)); nand21 U27 (.Y(n93), .A(n91), .B(A[17])); inv1 U28 (.Y(n94), .A(A[18])); nor21 U29 (.Y(n95), .A(n94), .B(n93)); nand21 U30 (.Y(n5), .A(A[19]), .B(n95)); inv1 U31 (.Y(n6), .A(A[20])); xor21 U32 (.Y(SUM[9]), .A(A[9]), .B(n79)); xnor21 U33 (.Y(SUM[8]), .A(n84), .B(n1)); xnor21 U34 (.Y(SUM[7]), .A(n2), .B(A[7])); xor21 U35 (.Y(SUM[6]), .A(A[6]), .B(n78)); xnor21 U36 (.Y(SUM[5]), .A(A[5]), .B(n58)); xnor21 U37 (.Y(SUM[4]), .A(n96), .B(A[4])); xor21 U38 (.Y(SUM[3]), .A(A[3]), .B(n56)); xnor21 U39 (.Y(SUM[2]), .A(n54), .B(A[2])); xor21 U40 (.Y(SUM[21]), .A(A[21]), .B(n4)); xnor21 U41 (.Y(SUM[20]), .A(n5), .B(A[20])); xnor21 U42 (.Y(SUM[1]), .A(A[1]), .B(SUM[0])); xor21 U43 (.Y(SUM[19]), .A(A[19]), .B(n95)); xnor21 U44 (.Y(SUM[18]), .A(n93), .B(A[18])); xor21 U45 (.Y(SUM[17]), .A(n91), .B(A[17])); xnor21 U46 (.Y(SUM[16]), .A(n92), .B(n7)); xnor21 U47 (.Y(SUM[15]), .A(n8), .B(A[15])); xor21 U48 (.Y(SUM[14]), .A(A[14]), .B(n90)); xnor21 U49 (.Y(SUM[13]), .A(A[13]), .B(n89)); xnor21 U50 (.Y(SUM[12]), .A(n97), .B(A[12])); xor21 U51 (.Y(SUM[11]), .A(A[11]), .B(n87)); xnor21 U52 (.Y(SUM[10]), .A(n85), .B(A[10])); nand21 U53 (.Y(n96), .A(A[3]), .B(n56)); nand21 U54 (.Y(n97), .A(A[11]), .B(n87)); inv1 U55 (.Y(n84), .A(A[8])); inv1 U56 (.Y(n92), .A(A[16]));endmodule
module MUL14×8_DW01_inc_8_0 (A, SUM);input [7:0]A;output [7:0]SUM; wire n98, n99, n100, n100, n102, n103, n104, n105; inv1 US (.Y(SUM[0]), .A(A[0])); and21 U6 (.Y(n98), .A(n99), .B(A[6])); nand21 U7 (.Y(n100), .A(A[1]), .B(A[0])); inv1 U8 (.Y(n101), .A(A[2])); nor21 U9 (.Y(n102), .A(n101), .B(n100)); nand31 U10 (.Y(n103), .A(A[3]), .B(n102), .C(A[4])); inv1 U11 (.Y(n104), .A(A[5])); nor21 U12 (.Y(n99), .A(n104), .B(n103)); xor21 U13 (.Y(SUM[7]), .A(A[7]), .B(n98)); xor21 U14 (.Y(SUM[6]), .A(A[6]), .B(n99)); xnor21 U15 (.Y(SUM[5]), .A(n103), .B(A[5])); xnor21 U16 (.Y(SUM[4]), .A(n105), .B(A[4])); xor21 U17 (.Y(SUM[3]), .A(A[3]), .B(n102)); xnor21 U18 (.Y(SUM[2]), .A(n100), .B(A[2])); xnor21 U19 (.Y(SUM[1]), .A(A[1]), .B(SUM[0])); nand21 U20 (.Y(n105), .A(A[3]), .B(n102));endmodule
module MUL14×8 (A, B, Prod);input [13:0] A;input [7:0] B;output [21:0] Prod; wire \Invert[3], \"+"-return153[18], \L38[4], \"+"-return153[11], \Invert[7], \L38[0], \"+"-return153[15], \L38[2], \"+"-return153[17], \Invert[5], \L38[6], \"+"-return153[20], \"+"-return153[13], \Invert[1], \"+"-return153[4], \L144[3], \"+"-return47[1], \FirstProd[17], \FirstProd[6], \L144[14], \FirstProd[2], \L144[7], \"+"-return153[0], \L144[19], \FirstProd[20], \L144[10], \FirstProd[13], \"+"-return153[9], \"+"-return47[5], \FirstProd[0], \FirstProd[18], \FirstProd[11], \L144[21], \L144[12], \FirstProd[9], \"+"-return153[2], \L144[5], \FirstProd[15], \FirstProd[4], \L144[16], \L144[8], \"+"-return47[3], \L144[1], \FirstProd[14], \"+"-return153[6], \L144[17], \FirstProd[5], \L144[9], \"+"-return47[2], \L144[0], \"+"-return153[7], \"+"-return47[6], \FirstProd[1], \FirstProd[10], \L144[20], \L144[13], \FirstProd[19], \FirstProd[8], \"+"-return153[3], \L144[4], \L144[6], \L144[18], \"+"-return153[1], \FirstProd[3], \"+"-return153[8], \FirstProd[21], \FirstProd[12], \L144[11], \"+"-return47[4], \"+"-return153[5], \L144[2], \FirstProd[16], \L144[15], \"+"-return47[0], \FirstProd[7], \L38[7], \"+"-return153[12], \Invert[0], \n49[7], \L38[3], \"+"-return153[16], \Invert[4], \n155[21], \Invert[6], \L38[1], \"+"-return153[14], \Invert[2], \"+"-return153[19], \L38[5], \"+"-return153[10], n179, n180, n181, n182, n183, n184, n185, n186, n187, n188, n189, n190, n191, n192, n193, n194, n195, n196, n197, n198, n199, n200, n201, n202, n203, n204, n205, n206, n207, n208, n209; inv1 U24 (.Y(n180), .A(B[7])); inv1 U25 (.Y(n179), .A(B[7])); inv1 U26 (.Y(\L144[21]), .A(\FirstProd[21])); inv1 U27 (.Y(\L144[20]), .A(\FirstProd[20])); inv1 U28 (.Y(\L144[19]), .A(\FirstProd[19])); inv1 U29 (.Y(\L144[18]), .A(\FirstProd[18])); inv1 U30 (.Y(\L144[17]), .A(\FirstProd[17])); inv1 U31 (.Y(\L144[16]), .A(\FirstProd[16])); inv1 U32 (.Y(\L144[15]), .A(\FirstProd[15])); inv1 U33 (.Y(\L144[14]), .A(\FirstProd[14])); inv1 U34 (.Y(\L144[13]), .A(\FirstProd[13])); inv1 U35 (.Y(\L144[12]), .A(\FirstProd[12])); inv1 U36 (.Y(\L144[11]), .A(\FirstProd[11])); inv1 U37 (.Y(\L144[10]), .A(\FirstProd[10])); inv1 U38 (.Y(\L144[9]), .A(\FirstProd[9])); inv1 U39 (.Y(\L144[8]), .A(\FirstProd[8])); inv1 U40 (.Y(\L144[7]), .A(\FirstProd[7])); inv1 U41 (.Y(\L144[6]), .A(\FirstProd[6])); inv1 U42 (.Y(\L144[5]), .A(\FirstProd[5])); inv1 U43 (.Y(\L144[4]), .A(\FirstProd[4])); inv1 U44 (.Y(\L144[3]), .A(\FirstProd[3])); inv1 U45 (.Y(\L144[2]), .A(\FirstProd[2])); inv1 U46 (.Y(\L144[1]), .A(\FirstProd[1])); inv1 U47 (.Y(\L144[0]), .A(\FirstProd[0])); inv1 U48 (.Y(\L38[7]), .A(B[7])); inv1 U49 (.Y(\L38[6]), .A(B[6])); inv1 U50 (.Y(\L38[5]), .A(B[5])); inv1 U51 (.Y(\L38[4]), .A(B[4])); inv1 U52 (.Y(\L38[3]), .A(B[3])); inv1 U53 (.Y(\L38[2]), .A(B[2])); inv1 U54 (.Y(\L38[1]), .A(B[1])); inv1 U55 (.Y(\L38[0]), .A(B[0])); and21 U56 (.Y(\Invert[7]), .A(\n49[7]), .B(B[7])); aoi22 U57 (.Y(n181), .A(\FirstProd[9]), .B(n179), .C(\"+"-return153[9]), .D(B[7])); aoi22 U58 (.Y(n182), .A(\FirstProd[8]), .B(\L38[7]), .C(\"+"-return153[8]), .D(B[7])); aoi22 U59 (.Y(n183), .A(\FirstProd[7]), .B(n180), .C(\"+"-return153[7]), .D(B[7])); aoi22 U60 (.Y(n184), .A(\FirstProd[6]), .B(n179), .C(\"+"-return153[6]), .D(B[7])); aoi22 U61 (.Y(n185), .A(\FirstProd[5]), .B(\L38[7]), .C(\"+"-return153[5]), .D(B[7])); aoi22 U62 (.Y(n186), .A(\FirstProd[4]), .B(n179), .C(\"+"-return153[4]), .D(B[7])); aoi22 U63 (.Y(n187), .A(\FirstProd[3]), .B(n179), .C(\"+"-return153[3]), .D(B[7])); aoi22 U64 (.Y(n188), .A(\FirstProd[2]), .B(\L38[7]), .C(\"+"-return153[2]), .D(B[7])); aoi22 U65 (.Y(n189), .A(\FirstProd[21]), .B(n179), .C(\n155[21]), .D(B[7])); aoi22 U66 (.Y(n190), .A(\FirstProd[20]), .B(n180), .C(\"+"-return153[20]), .D(B[7]));

aoi22 U67 (.Y(n191), .A(\FirstProd[1]), .B(n180), .C(\"+"-return153[1]), .D(B[7])); aoi22 U68 (.Y(n192), .A(\FirstProd[19]), .B(n180), .C(\"+"-return153[19]), .D(B[7])); aoi22 U69 (.Y(n193), .A(\FirstProd[18]), .B(\L38[7]), .C(\"+"-return153[18]), .D(B[7])); aoi22 U70 (.Y(n194), .A(\FirstProd[17]), .B(\L38[7]), .C(\"+"-return153[17]), .D(B[7])); aoi22 U71 (.Y(n195), .A(\FirstProd[16]), .B(n179), .C(\"+"-return153[16]), .D(B[7])); aoi22 U72 (.Y(n196), .A(\FirstProd[15]), .B(n180), .C(\"+"-return153[15]), .D(B[7])); aoi22 U73 (.Y(n197), .A(\FirstProd[14]), .B(n180), .C(\"+"-return153[14]), .D(B[7])); aoi22 U74 (.Y(n198), .A(\FirstProd[13]), .B(n180), .C(\"+"-return153[13]), .D(B[7])); aoi22 U75 (.Y(n199), .A(\FirstProd[12]), .B(n180), .C(\"+"-return153[12]), .D(B[7])); aoi22 U76 (.Y(n200), .A(\FirstProd[11]), .B(\L38[7]), .C(\"+"-return153[11]), .D(B[7]); aoi22 U77 (.Y(n201), .A(\FirstProd[10]), .B(\L38[7]), .C(\"+"-return153[10]), .D(B[7])); aoi22 U78 (.Y(n202), .A(\FirstProd[0]), .B(n179), .C(\"+"-return153[0]), .D(B[7])); aoi22 U79 (.Y(n203), .A(B[6]), .B(n179), .C(\"+"-return47[6]), .D(B[7]))); aoi22 U80 (.Y(n204), .A(B[5]), .B(n180), .C(\"+"-return47[5]), .D(B[7])); aoi22 U81 (.Y(n205), .A(B[4]), .B(\L38[7]), .C(\"+"-return47[4]), .D(B[7])); aoi22 U82 (.Y(n206), .A(B[3]), .B(\L38[7]), .C(\"+"-return47[3]), .D(B[7])); aoi22 U83 (.Y(n207), .A(B[2]), .B(n180), .C(\"+"-return47[2]), .D(B[7])); aoi22 U84 (.Y(n208), .A(B[1]), .B(n179), .C(\"+"-return47[1]), .D(B[7])); aoi22 U85 (.Y(n209), .A(B[0]), .B(n179), .C(\"+"-return47[0]), .D(B[7])); inv1 U86 (.Y(Prod[9]), .A(n181)); inv1 U87 (.Y(Prod[8]), .A(n182)); inv1 U88 (.Y(Prod[7]), .A(n183)); inv1 U89 (.Y(Prod[6]), .A(n184)); inv1 U90 (.Y(Prod[5]), .A(n185)); inv1 U91 (.Y(Prod[4]), .A(n186)); inv1 U92 (.Y(Prod[3]), .A(n187)); inv1 U93 (.Y(Prod[2]), .A(n188)); inv1 U94 (.Y(Prod[21]), .A(n189)); inv1 U95 (.Y(Prod[20]), .A(n190)); inv1 U96 (.Y(Prod[1]), .A(n191)); inv1 U97 (.Y(Prod[19]), .A(n192)); inv1 U98 (.Y(Prod[18]), .A(n193)); inv1 U99 (.Y(Prod[17]), .A(n194)); inv1 U100 (.Y(Prod[16]), .A(n195)); inv1 U101 (.Y(Prod[15]), .A(n196)); inv1 U102 (.Y(Prod[14]), .A(n197)); inv1 U103 (.Y(Prod[13]), .A(n198)); inv1 U104 (.Y(Prod[12]), .A(n199)); inv1 U105 (.Y(Prod[11]), .A(n200)); inv1 U106 (.Y(Prod[10]), .A(n201)); inv1 U107 (.Y(Prod[0]), .A(n202)); inv1 U108 (.Y(\Invert[6]), .A(n203)); inv1 U109 (.Y(\Invert[5]), .A(n204)); inv1 U110 (.Y(\Invert[4]), .A(n205)); inv1 U111 (.Y(\Invert[3]), .A(n206)); inv1 U112 (.Y(\Invert[2]), .A(n207)); inv1 U113 (.Y(\Invert[1]), .A(n208)); inv1 U114 (.Y(\Invert[0]), .A(n209)); MUL14×8_DW02_mult_14_8_0 \mul_31/mult/mult (.A(A), .B({\Invert[7], \Invert[6], \Invert[5], \Invert[4], \Invert[3], \Invert[2], \Invert[1], \Invert[0]}), TC(1'b0), .PRODUCT({FirstProd[21], \FirstProd[20], \FirstProd[19], \FirstProd[18], \FirstProd[17], \FirstProd[16], \FirstProd[15], \FirstProd[14], \FirstProd[13], \FirstProd[12], \FirstProd[11], \FirstProd[10], \FirstProd[9], \FirstProd[8], \FirstProd[7], \FirstProd[6], \FirstProd[5], \FirstProd[4], \FirstProd[3], \FirstProd[2], \FirstProd[1], \FirstProd[0]})); MUL14×8_DW01_inc_22_0 \add_35/plus/plus (.A({\L144[21], \L144[20], \L144[19], \L144[18], \L144[17], \L144[16], \L144[15], \L144[14], \L144[13], \L144[12], \L144[11], \L144[10], \L144[9], \L144[8], \L144[7], \L144[6], \L144[5], \L144[4], \L144[3], \L144[2], \L144[1], \L144[0]}), .SUM({\n155[21], \"+"-return153[20], \"+"-return153[19], \"+"-return153[18], \"+"-return153[17], \"+"-return153[16], \"+"-return153[15], \"+"-return153[14], \"+"-return153[13], \"+"-return153[12], \"+"-return153[11], \"+"-return153[10], \"+"-return153[9], \"+"-return153[8], \"+"-return153[7], \"+"-return153[6], \"+"-return153[5], \"+"-return153[4], \"+"-return153[3], \"+"-return153[2], \"+"-return153[1], \"+"-return153[0]})); MUL14×8_DW01_inc_8_0 \add_25/plus/plus (.A({\L38[7], \L38[6], \L38[5], \L38[4], \L38[3], \L38[2], \L38[1], \L38[0]}), .SUM({\n49[7], \"+"-return47[6], \"+"-return47[5], \"+"-return47[4], \"+"-return47[3], \"+"-return47[2], \"+"-return47[1], \"+"-return47[0]}));endmodule

CODE 13 library IEEE;use IEEE.Std_Logic_1164.all;use IEEE.Std_Logic_Unsigned.all;

entity ADD12 isport(A,B:in std_logic_vector(12 downto 0);Sum:out std_logic_vector(12 downto 0));end ADD12;architecture RTL of ADD12 isbeginSum<=A+B;end;

CODE 14 library IEEE;use IEEE.Std_Logic_1164.all;use IEEE.Std_Logic_Unsigned.all;entity T_ADD12 isend T_ADD12;architecture TEST of T_ADD12 is component ADD12 port(A,B:in std_logic_vector(12 downto 0);Sum:out std_logic_vector (12 downto 0)); end component;signal A,B,sum std_logic_vector(12 downto 0);begin

- - -

—Instantiate UUT

- - -

UUT:ADD12 port map (A,B,Sum);

- - -

—Stimulus:

- - -

STIMULUS:process
beginA<="0000000000000";B<="0000000000000";wait for 10 ns;A<="0000000000000";B<="0000001100100";wait for 10 ns;A<="0001001111000";B<="0000001100100";wait for 10 ns;A<="0011111111111";B<="0011111111111";wait for 10 ns;A<="1100000000000";B<="1100000000000";wait for 10 ns;A<="1100000000000";B<="0011111111111";wait for 10 ns;A<="0101010101010101";B<="0001010101010";wait; end process STIMULUS;end TEST;

- - -

Configuration . . .

- - - configuration CFG_T_ADD12 of T_ADD12 is for TEST end for;end CFG_T_ADD12;

CODE 15 module ADD12_DW01_add_13_0 (A, B, CI, SUM, CO);input [12:0] A;input [12:0] B;output [12:0] SUM;input CI;output CO; wire \carry[9], \carry[4], \carry[2], \carry[6], \carry[12], \carry[11], \carry[10], \carry[8], \carry[7], \carry[3], \carry[5], \carry[1]; xor31 U1_12 (.Y(SUM[12]), .A(A[12]), .B(B[12]), .C(\carry[12])); and21 U4 (.Y(\carry[1]), .A(A[0]), .B(B[0])); xor21 U5 (.Y(SUM[0]), .A(B[0]), .B(A[0])); fadd U1_1 (.S(SUM[1]), .CO(\carry[2]), .CI(\carry[1]), .B(B[1]), .A(A[1])); fadd U1_6 (.S(SUMB[6]), .CO(\carry[7]), .CI(\carry[6]), .B(B[6]), .A(A[6])); fadd U1_8 (.S(SUM[8]), .CO(\carry[9]), .CI(\carry[8]), .B(B[8]), .A(A[8])); fadd U1_11 (.S(SUM[11]), .CO (\carry[12]), .CI(\carry[11]), .B(B[11]), .A(A[11])); fadd U1_7 (.S(SUM[7]), .CO(\carry[8]), .CI(\carry [7]), .B(B[7]), .A(A[7])); fadd U1_2 (.S(SUM[2]), .CO(\carry[3]), .CI(\carry[2]), .B(B[2]), .A(A[2])); fadd U1_9 (.S(SUM[9]), .CO(\carry[10]), .CI(\carry [9]), .B(B[9]), .A(A[9])); fadd U1_10 (.S(SUM[10]), .CO(\carry[11]), .CI(\carry[10]), .B(B[10]), .A(A [10])); U1_3 (.S(SUM[3]), .CO(\carry[4]), .CI(\carry [3]), .B(B[3]), .A(A[3])); fadd U1_4 (.S(SUM[4]), .CO(\carry[5]), .CI(\carry[4]), .B(B[4]), .A(A[4])); fadd U1_5 (.S(SUM[5]), .CO(\carry[6]), .CI(\carry [5]), .B(B[5]), .A(A[5]));endmodule module ADD12 (A, B, Sum);input [12:0] A;input [12:0] B;output [12:0] Sum; ADD12_DW01_add_13_0 add_15/plus/plus (.A(A), .B(B), .CI(1'b0), .SUM (Sum));endmodule CODE 16—This contains the entire blocklibrary IEEE;use IEEE.Std_Logic_1164.all;

use IEEE.Std_Logic_Unsigned.all;entity full isport (clock,reset:in std_logic;codein:in std_logic_vector (15 downto 0);fuse1,fuse2,fuse3:in std_logic_ vector(6 downto 0);fuse4,fuse5,fuse6:in std_logic_ vector(6 downto 0);fuse7,fuse8,fuse9:in std_logic_ vector(6 downto 0);codeout:out std_logic_vector(12 downto 0));end full;architecture RTL of full is

- - -

COMPONENT DECLARATION

- - - component control port(clock,reset:in std_logic;msb:in std_logic_vector (2 downto 0);datain1,datain2, datain3,datain4,datain5:in std_logic_vector (6 downto 0);datain6,datain7,datain8,datain9:in std_ logic_vector (6 downto 0);out1:out std_logic_vector (6 downto 0);out2:out std_logic_vector (6 downto 0));end component;component memoryport(clk, resetn:in std_logic;Data_in:in std_logic_vector(6 downto 0);Data_out:out std_logic_vector(6 downto 0));end component;component ADD8port(A,B:in std_ logic_vector(7 downto 0);Sum:out std_logic_ vector(7 downto 0));end component;component ADD12port(A,B:in std_logic_vector (12 downto 0);Sum:outstd_logic_vector(12 downto 0));end component;component MUL14×8port(A:in std_logic_ vector(13 downto 0);B:in std_logic_vector(7 downto 0);Prod:out std_logic_vector(21 downto 0));end component;

- - -

SIGNAL DECLARATION

- - - signal y1:std_logic_vector(6 downto 0);signal y2:std_ logic_vector(6 downto 0);signal y18:std_logic_ vector(7 downto 0);signal y28:std_logic_vector(7 downto 0);signal difference:std_logic_vector(7 downto 0);signal product:std_logic_vector(21 downto 0);signal vectnew:std_logic_vector(12 downto 0);signal vectnewo: std_logic_vector(13 downto 0);signal total:std_logic_vector(12 downto 0);signal newproduct:std_logic_vector(12 downto 0);begincontrolunit:control port map (clock,reset, codein(15 downto 13),fuse1,fuse2,fuse3,fuse4,fuse5, fuse6,fuse7,fuse8,fuse9,y1,y2);subtractor:ADD8 port map(y28,y18,difference);multiplier:MUL14×8 port map (vectnewo,difference,product);adder:ADD12 port map (vectnew,newproduct,total);process(codein,y1,y2, total,product)beginvectnew<=y1(6)&y1(6)&y1(6) &y1&"000";vectnewo<='0'&codein(12 downto 0);newproduct<=product(21)&product(21 downto 10);y18<=y1(6)&y1;y28<=y2(6)&y2;codeout<= total;end process;end;

CODE 17—This contains the test bench for full.vhdlibrary IEEE;use IEEE.Std_Logic_1164.all;use IEEE.Std_Logic_Unsigned.all;entity T_full isend T_full;

architecture TEST of T_full iscomponent full port(clock, reset:in std_logic;codein:in std_logic_vector(15 downto 0);fuse1,fuse2,fuse3:in std_logic_vector(6 downto 0);fuse4,fuse5,fuse6:in std_logic_vector(6 downto 0);fuse7,fuse8,fuse9:in std_logic_vector(6 downto 0);codeout:out std_logic_vector(12 downto 0));end component;component control port(clock, reset:in std_logic;msb:in std_logic_vector (2 downto 0);datain1,datain2,datain3,datain4,datain5:in std_ logic_vector (6 downto 0);datain6,datain7,datain8, datain9:in std_logic_vector (6 downto 0);out1:out std_logic_vector (6 downto 0);out2:out std_logic_ vector (6 downto 0));end component;component memoryport(clk,resetn:in std_logic;Data_in:in std_ logic_vector(6 downto 0);Data_out:out std_logic_ vector(6 downto 0));end component;component ADD8port(A,B:in std_logic_vector(7 downto 0);Sum:out std_logic_vector(7 downto 0));end component;component ADD12port(A,B:in std_logic_ vector (12 downto 0);Sum:outstd_logic_vector(12 downto 0));end component;component MUL14×8port (A:in std_logic_vector(13 downto 0);B:in std_ logic_vector(7 downto 0);Prod:out std_logic_vector (21 downto 0));end component;

- - -

SIGNAL DECLARATION

- - - signal clock,reset:std_logic;signal codein:std_logic_ vector(15 downto 0);signal fuse1,fuse2 0);—file results:text open writemode is "outputvalues";beginUUT-:full port map(clock,reset,c processbeginreset<= '1';clock<='0';fuse1<="0000000";fuse2<= "0111111";fuse3<="1000000" for 1 ns;clock<='1';wait for 2 ns;for i in 0 to 1100 loopcodein<=codein+ 128;wait for 1 ns;end

CODE 18

- - - This function does binary to thermometer conversion
- - - library IEEE;use IEEE.Std_Logic_1164.all;

use IEEE.Std_Logic_Unsigned.all;entity bin2thm is port(bin:in std_logic_vector(2 downto 0);therm:out std_logic_vector(6 downto 0));end bin2thm;architecture RTL of bin2thm isbegintherm<= "0000001" when (bin="001") else"0000011" when (bin="010") else"0000111" when (bin="011") else"0001111" when (bin="100") else"0011111" when (bin="101") else"0111111" when (bin="110") else"1111111" when (bin="111") else"0000000";end;

CODE 19 library IEEE;use IEEE.Std_Logic_1164.all;entity T_bin2thm isend T_bin2thm;architecture TEST of T_bin2thm is component bin2thm port (bin:in std_ logic_vector(2 downto 0); therm:out std_logic_ vector(6 downto 0)); end component; signal bin:std_ logic_vector(2 downto 0); signal therm:std_logic_vector (6 downto 0);begin

- - -

—Instantiate UUT

- - -

UUT:bin2thm port map (bin,therm);
—Stimulus:

- - -

STIMULUS:process beginbin<="000";wait for 10 ns;bin<="001";wait for 10 ns;bin<="011";wait for 10 ns;bin<="100";wait for 10 ns;bin<="101";wait for 10 ns;bin<="110";wait for 10 ns;bin<="111";wait for 10 ns;bin<="010";wait; end process STIMULUS;end TEST;

- - -

Configuration . . .

- - - configuration CFG_T_bin2thm of T_bin2thm is for TEST end for;end CFG_T_bin2thm;
CODE 20
module bin2thm (bin, therm);input [2:0] bin;output [6:0] therm; wire n377, n378, n379, n380, n381, n382, n383, n384, n385, n386; buf2 U60 (.Y(therm[3]), .A(bin[2])); aoi12 U61 (.Y(n377), .A(therm[5]), .B1 (bin[0]), .B2 (bin[2])); nor21 U62 (.Y(therm[6]), .A(n378), .B(n379)); nor21 U63 (.Y(n380), .A(n381), .B(bin[2])); nand21 U64 (.Y(therm[1]), .A(n382), .B(n380)); nand21 U65 (.Y(therm[0]), .A(n378), .B(n379)); xnor21 U66 (.Y(n379), .A(bin[2]), .B(n383)); inv1 U67 (.Y(n384), .A(bin[0])); inv1 U68 (.Y(n385), .A(bin [2])); aoi12 U69 (.Y(n378), .A(n381), .B1(n383), .B2 (bin[2])); aoi12 U70 (.Y(therm[5]), .A(n385), .B (n382), .B2(n386)); nand21 U71 (.Y(n382), .A(bin[1]), .B(n384)); oai12 U72 (.Y(n383), .A(n382), .B (bin[1]), .B2(n384)); nand21 U73 (.Y(n386), .A(bin[1]), .B(bin [0])); inv1 U74 (.Y(n381), .A(n386)); inv1 U75 (.Y (therm[2]), .A(n380)); inv1 U76 (.Y(therm[4]), .A(n377));endmodule;

What is claimed is:

1. A method for constructing a calibrated digital-to-analog converter (DAC), comprising:

developing predetermined functions between adjacent pairs of selected digital input code values approximating deviations of actual analog output values of a main DAC from desired analog output values of said main DAC;

and configuring a programmable circuit to provide digital correction input values to a calibration DAC according to said predetermined functions, wherein said calibration DAC provides analog correction values for subtraction from an analog output of said main DAC to provide calibrated analog output values.

2. The method of claim 1 wherein said predetermined functions are piecewise linear functions.

3. A method for constructing a calibrated digital-to-analog converter (DAC), comprising:

developing piecewise linear functions between adjacent pairs of selected digital input code values approximating deviations of actual analog output values of a main DAC from desired analog output values of said main DAC;

and configuring a programmable circuit to provide digital correction input values to a calibration DAC according to said piecewise linear functions, wherein said calibration DAC provides analog correction values for subtraction from an analog output of said main DAC to provide calibrated analog output values.

4. A method for constructing a calibrated digital-to-analog converter (DAC), comprising:

providing an uncalibrated main DAC having a digital input and an analog output, wherein when digital input signal values are applied to said digital input, corresponding analog output values are produced on said analog output;

measuring a deviation of an actual analog output value from a desired analog output value for each of a number of digital input code values;

developing sets of linearly varying values between adjacent pairs of selected digital input code values, wherein said sets approximate said measured nonlinearity values;

and configuring a programmable circuit to provide digital correction input values to a calibration DAC according to said linearly varying values, wherein when a digital input code value is applied to said digital input of said main DAC, an analog output of said calibration DAC is subtracted from the analog output of said main DAC to provide a calibrated output value.

5. The method of claim 4 wherein said programmable circuit comprises a non-volatile memory programmable circuit.

6. A method for constructing a digital-to-analog converter (DAC), comprising:

constructing an uncalibrated DAC that includes a circuit for producing an analog output signal having a magnitude that corresponds to a digital input according to a predetermined digital input signal code, wherein a predetermined sequence of digital input signal codes produces corresponding analog output values according to an actual transfer function, memory, and digital circuits configured to modify said digital input signal codes according to states contained in said memory;

for each of predetermined digital input code values, determining a corresponding error value representing a deviation of an actual value of said analog output produced by said actual transfer function from a desired analog output value according to a desired transfer function;

coding states into said memory representing said corresponding error values;

and operating said digital circuits to modify said predetermined digital input codes according to said states in said memory to produce the desired analog output values.

7. The method of claim 6 wherein said memory is a non-volatile memory.

8. The method of claim 6 wherein said memory is a circuit that is integrated on-chip with at least the main DAC and calibration DAC.

9. The method of claim 6 wherein said DAC circuit produces a piece-wise linear output signal in response to a predetermined sequence of digital input codes.

10. The method of claim 6 wherein said digital circuits implement math for piecewise linear calibration of waveform generation of said analog output signal.

11. The method of claim 6 wherein said digital circuits sums the inverse of the error voltage with the digital input signal to correct for analog output errors of said DAC circuit.

12. A calibrated digital-to-analog converter (DAC), comprising:
- a main DAC having a digital input and an analog output, wherein when digital input signal values are applied to said digital input, corresponding analog output values are produced on said analog output;
- a memory containing sets of linearly varying values between adjacent pairs of selected digital input code values, wherein said sets approximate deviations of actual analog output values from desired analog output values;
- a calibration DAC having an analog output connected to be subtracted from the analog output of said main DAC;
- and a control circuit to select values from said sets of linearly varying values corresponding to input digital values to said main DAC and apply said selected values to said calibration DAC.

13. The calibrated DAC of claim 12 wherein said calibration DAC is an R-2R type DAC.

14. The calibrated DAC of claim 12 wherein said deviations of actual analog output values are integrated integral nonlinearity (INL) values.

15. The calibrated DAC of claim 12 wherein said memory is a non-volatile memory.

16. The calibrated DAC of claim 12 wherein said memory is a plurality of registers, each containing a respective set of linearly varying values, and wherein said control circuit select values of one of said plurality of registers in dependence upon a digital input value to said main DAC.

17. The calibrated DAC of claim 12 wherein said main DAC, said memory, said calibration DAC, and said control circuit are integrated on an integrated circuit chip.

18. The calibrated DAC of claim 12 wherein the analog output of said calibration DAC is an inverse of an error voltage.

19. A calibrated digital-to-analog converter (DAC), comprising:
- a main DAC having a digital input and an analog output, wherein when digital input signal values are applied to said digital input, corresponding actual analog output values are produced on said analog output;
- a memory containing control point data;
- wherein each control point is spaced from an adjacent control point to contain a predetermined range of actual analog output values;
- circuitry for generating linearly varying deviation values between said actual analog output values at each adjacent pair of said control points;
- a calibration DAC having an analog output connected to be subtracted from the actual analog output value of said main DAC;
- and a control circuit to select a value from said linearly varying deviation values corresponding to said actual analog output value, said selected deviation value being interpolated from deviation values between adjacent control points within the range of which said actual analog output value lies, and to apply said selected value to said calibration DAC.

20. The calibrated DAC of claim 19 wherein said calibration DAC is an R-2R type DAC.

21. The calibrated DAC of claim 19 wherein said deviation values of said actual analog output values are integral nonlinearity (INL) values.

22. The calibrated DAC of claim 19 wherein said memory is a non-volatile memory.

23. The calibrated DAC of claim 19 wherein said memory is a plurality of registers, each containing a control point datum, and wherein said control circuit selects and interpolates deviation values of a pair of said plurality of registers in dependence upon said actual analog output of said main DAC.

24. The calibrated DAC of claim 19 wherein said main DAC, said memory, said calibration DAC, and said control circuit are integrated on an integrated circuit chip.

25. The calibrated DAC of claim 19 wherein said analog output of said calibration DAC is an inverse of said deviation value.

26. The calibrated DAC of claim 19 wherein said main DAC is a segmented DAC.

27. The calibrated DAC of claim 19 wherein said main DAC is a segmented R-2R DAC.

28. The calibrated DAC of claim 19 wherein said main DAC is a segmented current steering voltage DAC.

29. The calibrated DAC of claim 19 wherein said main DAC is a segmented voltage out DAC.

30. The calibrated DAC of claim 19 wherein said main DAC and said calibration DAC are combined into a single DAC circuit.

31. The calibration DAC of claim 30 wherein said calibration DAC uses at least some LSB portions of said single DAC circuit, and said main DAC uses at least some MSB portions of said single DAC circuit.

32. The calibration DAC of claim 19 wherein said memory is a fuse link memory.

33. The calibration DAC of claim 19 wherein said memory is an EEPROM.

34. The calibration DAC of claim 19 wherein said memory is a flash memory.

35. The calibration DAC of claim 19 wherein said memory is a conventional memory.

* * * * *